(12) United States Patent
Coelho, Jr. et al.

(10) Patent No.: US 9,659,142 B1
(45) Date of Patent: May 23, 2017

(54) METHODS, SYSTEMS, AND ARTICLES OF MANUFACTURE FOR TRACE WARPING FOR ELECTRONIC DESIGNS

(71) Applicant: Cadence Design Systems, Inc., San Jose, CA (US)

(72) Inventors: Claudionor Jose Nunes Coelho, Jr., Menlo Park, CA (US); Chung-Wah Norris Ip, Cupertino, CA (US); Thiago Radicchi Roque, Mountain View, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/876,141

(22) Filed: Oct. 6, 2015

(51) Int. Cl.
*G06F 17/50* (2006.01)

(52) U.S. Cl.
CPC ...... *G06F 17/5081* (2013.01); *G06F 17/5009* (2013.01)

(58) Field of Classification Search
CPC ............ G06F 17/5009; G06F 17/5045; G06F 17/5081
USPC ........................................................ 716/136
See application file for complete search history.

(56) References Cited

U.S. PATENT DOCUMENTS

| | | | |
|---|---|---|---|
| 6,618,841 B1 * | 9/2003 | Huang | G06F 17/504 716/103 |
| 6,760,866 B2 * | 7/2004 | Swoboda et al. | G06F 9/3005 713/601 |
| 6,915,248 B1 | 7/2005 | Ip | |
| 7,065,726 B1 | 6/2006 | Singhal et al. | |
| 7,137,078 B2 | 11/2006 | Singhal et al. | |
| 7,159,198 B1 | 1/2007 | Ip et al. | |
| 7,237,208 B1 | 6/2007 | Ip et al. | |
| 7,418,678 B1 | 8/2008 | Ip et al. | |
| 7,421,668 B1 | 9/2008 | Ip et al. | |
| 7,437,694 B1 | 10/2008 | Loh et al. | |
| 7,506,288 B1 | 3/2009 | Ip et al. | |
| 7,647,572 B1 | 1/2010 | Ip et al. | |
| 7,895,552 B1 | 2/2011 | Singhal et al. | |
| 8,205,187 B1 | 6/2012 | Coelho et al. | |
| 8,527,911 B1 | 9/2013 | Kranen et al. | |
| 8,572,527 B1 | 10/2013 | Coelho et al. | |
| 8,630,824 B1 | 1/2014 | Ip et al. | |
| 8,731,894 B1 | 5/2014 | Kranen et al. | |
| 8,831,925 B1 | 9/2014 | Kranen et al. | |

(Continued)

OTHER PUBLICATIONS

Balakrishnan et al., "Formal Verification—An Overview", URL: http://vlsi.pro/formalverificationanoverview/, Oct. 17, 2012, Accessed on Jul. 14, 2015.

*Primary Examiner* — Sun Lin
(74) *Attorney, Agent, or Firm* — Vista IP Law Group, LLP

(57) ABSTRACT

Disclosed are techniques for implementing trace warping for electronic designs. These techniques identify a portion of an electronic design including a set of signals of interest corresponding to a plurality of simulation combinations over a range of clock cycles in a trace display. A pair of matching simulation combinations is identified from one or more pairs of matching simulation combinations for the set of signals of interest; and a first clock cycle and a second clock cycle corresponding to the pair of matching simulation combinations are identified in the range of clock cycles. A plurality of clock cycles between the first clock cycle and the second clock cycle can be compressed in the trace display.

20 Claims, 21 Drawing Sheets

(56) References Cited

U.S. PATENT DOCUMENTS

| | | |
|---|---|---|
| 8,863,049 B1 | 10/2014 | Lundgren et al. |
| 8,984,461 B1 | 3/2015 | Ip et al. |
| 8,990,745 B1 * | 3/2015 | Coelho et al. ...... G06F 17/5081 716/100 |
| 9,081,927 B2 | 7/2015 | Coelho et al. |
| 9,449,196 B1 | 9/2016 | Purri et al. |
| 9,477,802 B1 | 10/2016 | Ip et al. |
| 2015/0135150 A1 | 5/2015 | Hanna et al. |

* cited by examiner

| 424 Identify a 1ST Signal as a Candidate to Add Locally or Globally into a Set of Signals of Interest for a Trace |

| 426 Determine Whether the 1ST Signal Has Multiple Values Within an Irrelevant Portion in a Trace |

| 428 Reclassify the Irrelevant Portion into One or More Irrelevant Portions and One or More relevant Portions |

| 430 Representing the Trace with One or More Different Compressed Cycles by Compress the One or More Irrelevant Portions |

FIG. 4C

| 432 Identify An Irrelevant Portion in the Trace |

| 434 Determine A List of Candidate Signals & Add the List of Candidate Signals to the Set of Signals of Interest, Each Candidate Signal Having Multiple Values Among Clock Cycles in the Irrelevant Portion |

| 436 Modify the Irrelevant Portion of the Trace by Decompressing at Least A Part of the Irrelevant Portion into One or More Relevant Portions |

FIG. 4F

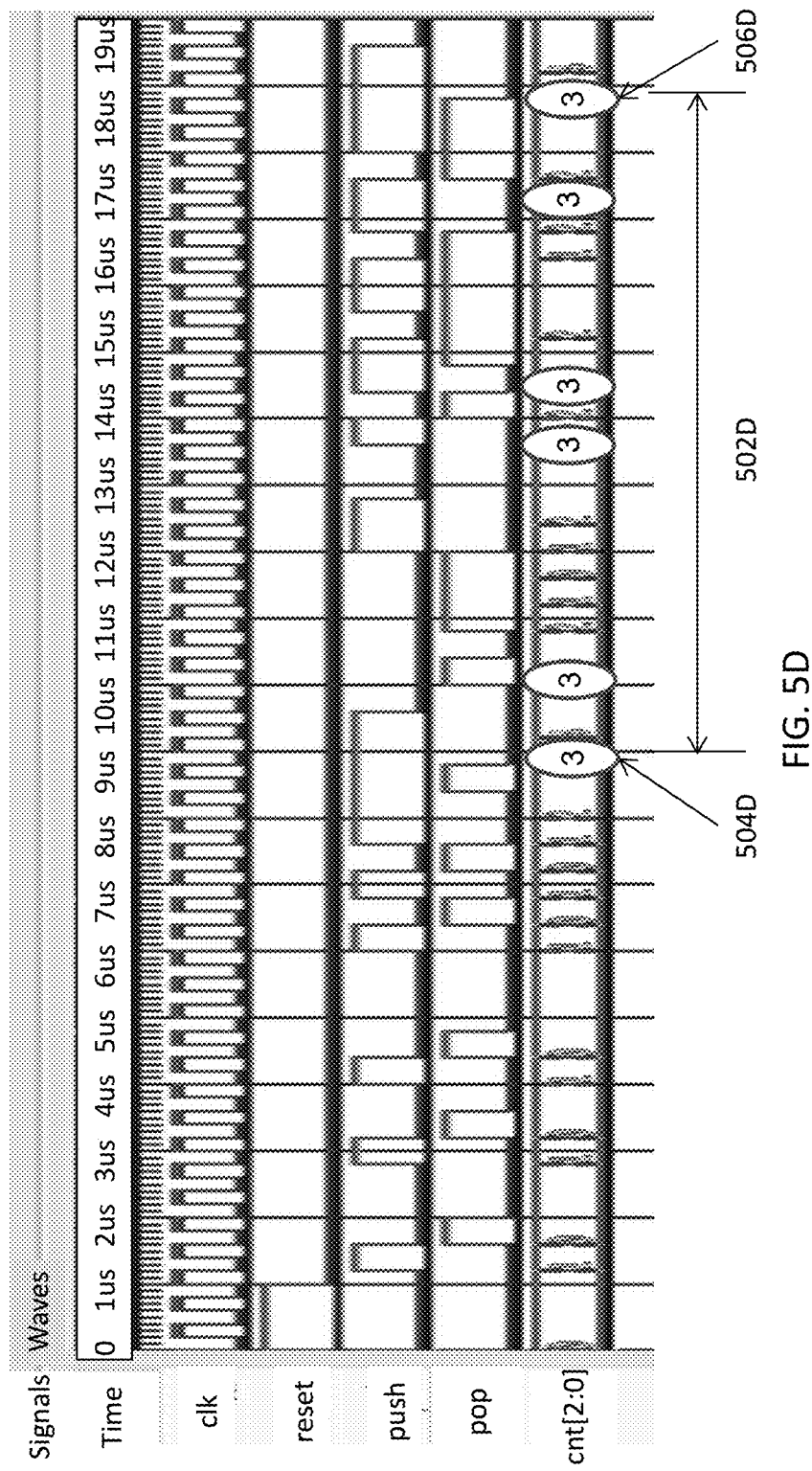

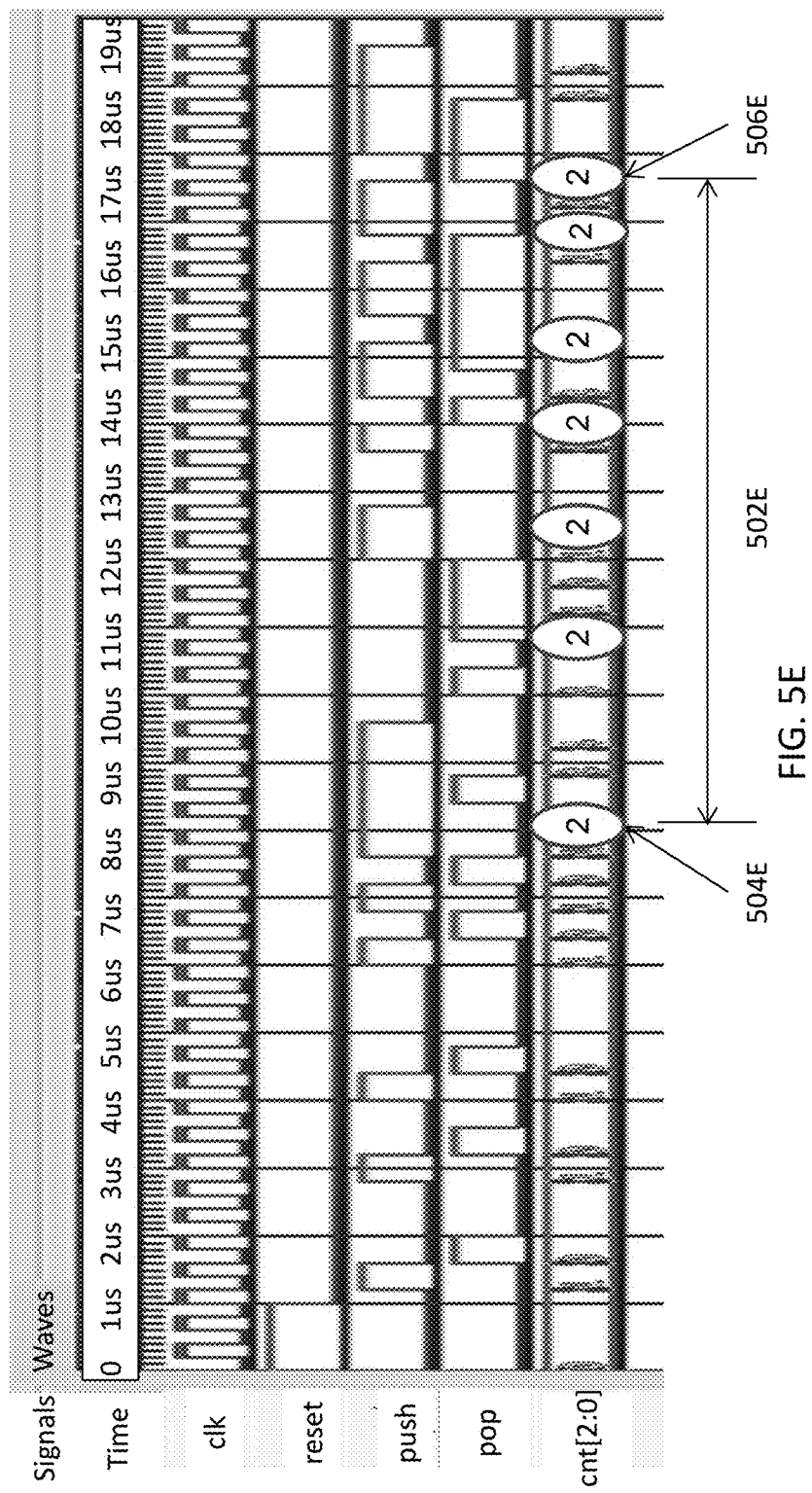

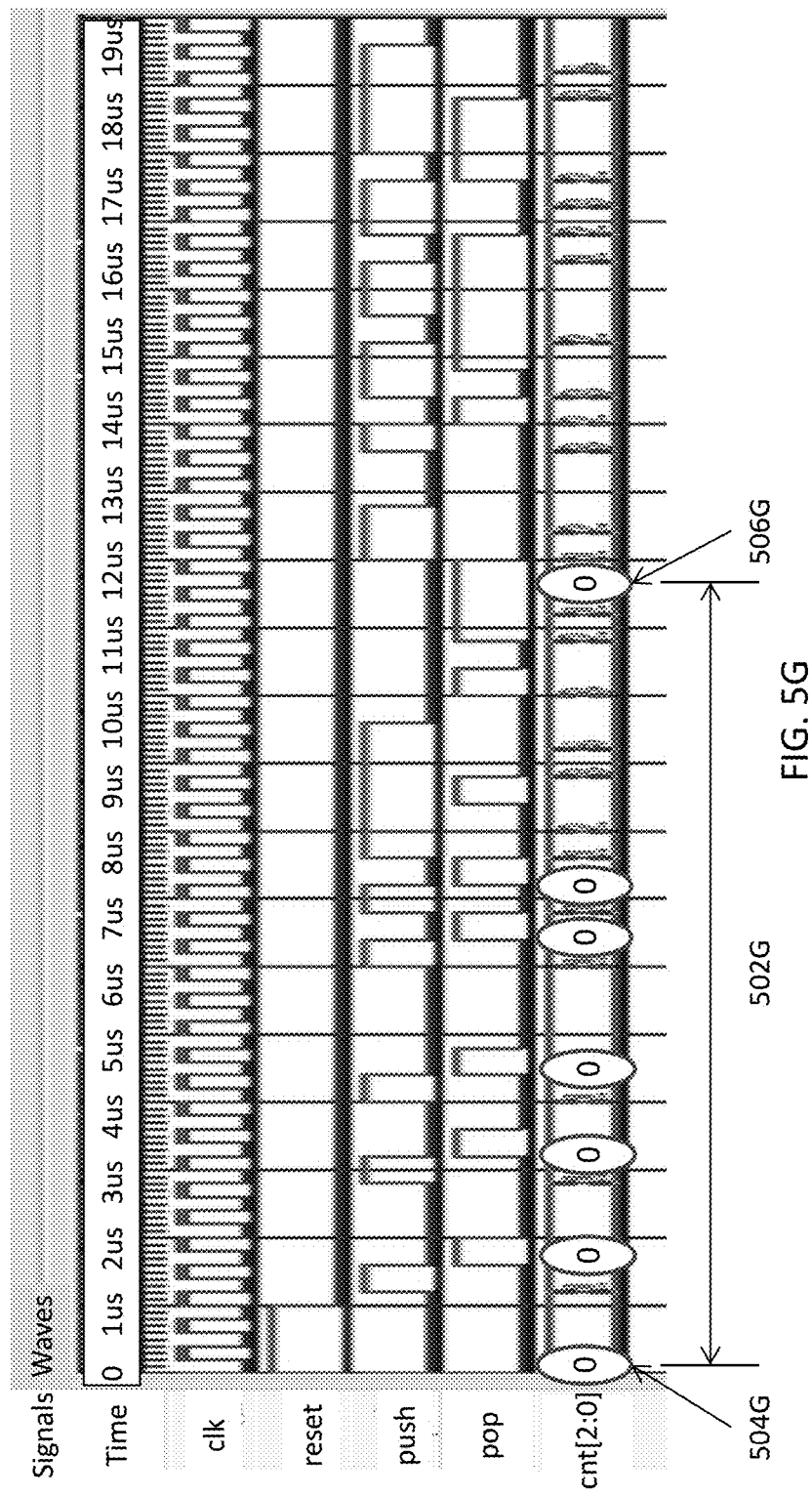

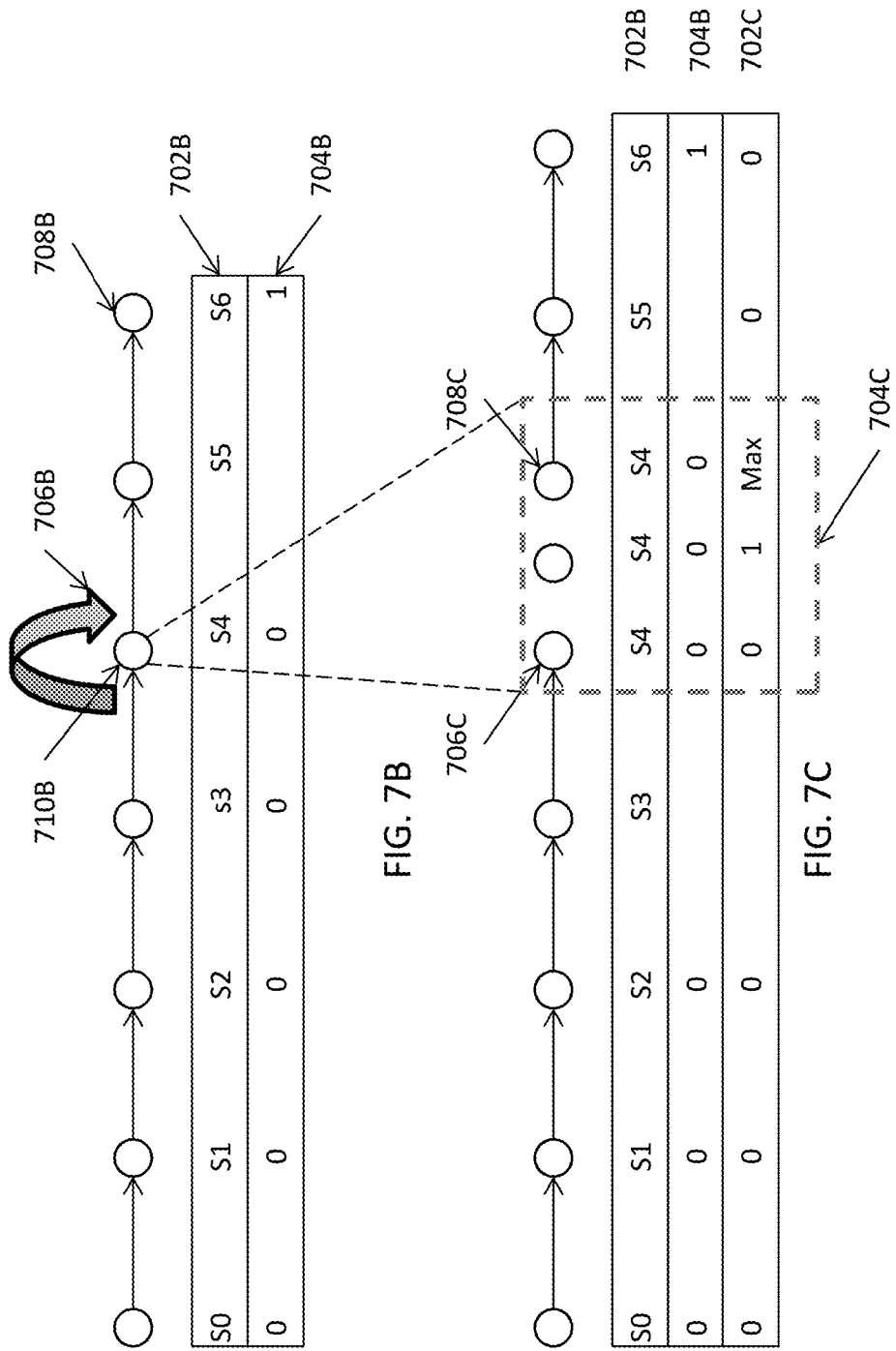

METHODS, SYSTEMS, AND ARTICLES OF MANUFACTURE FOR TRACE WARPING FOR ELECTRONIC DESIGNS

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Modern electronic design automation (EDA) tools are devised to communicate design intent and the circuit behavior between a circuit designer and other technical personnel such as design team member. To facilitate better understanding and more versatilities in the applications of these EDA tools, textual and/or graphical interfaces are often embedded in these EDA tools so as to enhance the understanding and visualization of various aspects of an electronic design. These textual and graphical interfaces display and often annotate or emphasize traces (waveforms) of various signals in an electronic design. To display traces, these EDA tools utilize various types of timing waveform diagrams, finite state machine transition diagrams, process flowcharts, etc. For example, verification and debugging tools may operate on a digital representation of an electronic circuit, a list of inputs, and data regarding the behavior of the circuit components. These verification and debugging tools generate a numerical or graphical representation of the electronic circuit response (e.g., a trace display) that may be viewed on a display screen in graphical form.

With the number of transistors in an integrated circuit (IC) doubling approximately every two years according to the Moore's law, contemporary electronic designs have become increasingly bigger and more complex over time. As a result, a typical trace display of an electronic design may span across millions of clock cycles. This sheer number of clock cycles renders the trace display on a reasonably sized display apparatus nearly illegible. Some conventional approaches tackle this challenge by identifying a pattern that is repeated for a number of instances in a waveform display as the pattern of interest and presenting this identified pattern for further analyses. Nonetheless, these conventional approaches lack flexibility and interactivity and may be overly pessimistic in some cases and overly optimistic in some other cases. Some other conventional approaches emphasize a portion of a trace display with graphical emphasis (e.g., highlighting). Even with the graphical emphasis, these conventional approaches still fail to improve the resolution of a trace display (e.g., the same number of pixels displaying the same range of clock cycles) or the legibility of the trace display.

Therefore, there exists a need for a method, system, and computer program product for implementing trace warping for electronic designs.

SUMMARY

Disclosed are method(s), system(s), and article(s) of manufacture for implementing trace warping for electronic designs in various embodiments. Some first embodiments are directed at a method for implementing trace warping for electronic designs. Some embodiments are directed to a method for implementing trace warping for electronic designs. In these embodiments, at least a portion of an electronic design having a set of signals of interest corresponding to a plurality of simulation combinations over a range of clock cycles in a trace display may be identified; a pair of matching simulation combinations may be identified from one or more pairs of matching simulation combinations for the set of signals of interest; a first clock cycle and a second cycle corresponding to the pair of matching simulation combinations in the range of clock cycles may be identified; and a plurality of clock cycles between the first clock cycles and the second clock cycle may be compressed in the trace display.

In some of these embodiments, a target signal having a signal state in a target clock cycle may be identified into the set of signals of interest; and one or more relevant signals may be identified into the set of signals of interest based in part or in whole upon the target signal. One or more cone of influence analyses, one or more why analyses, or a combination of one or more cone of influence analyses and one or more why analyses may be optionally performed for the target signal to identify the one or more relevant signals. In some embodiments, the set of signals of interest may comprise all signals for the at least the portion of the electronic design. In addition or in the alternative, trace warping may be performed by partitioning the trace display or the range of clock cycles therein with at least the pair matching simulation combinations into an irrelevant portion and one or more relevant portions.

In some embodiments, the act of compressing the plurality of clock cycles between the first clock cycles and the second clock cycle may be performed at least by graphically and/or textually de-emphasizing, suppressing, collapsing, or hiding the plurality of clock cycles between the first clock cycle and the second clock cycle into a single clock cycle; representing the plurality of clock cycles with a symbolic representation indicative of a compressed transition; and isolating a candidate root cause for a signal state of interest by performing verification or debugging on a compressed trace display having the plurality of clock cycles represented as the single clock cycle.

In some embodiments, a first signal may be identified for the at least the portion of the electronic design; and the first signal may be ignored or excluded from a subsequent determination of the one or more pairs of matching simulation combinations. In addition or in the alternative, a first signal value or state may be identified for the first clock cycle and a second signal value or state; and it may be determined whether the first signal value or state matches the second signal value or state. In some of these aforementioned embodiments, the act of identifying the first signal value or state for the first clock cycle and the second signal value or state comprising may include the act of transforming a first simulation combination for the first clock cycle into the first signal value or state and the act of transforming a second simulation combination for the second clock cycle into the second signal value or state.

In some embodiments for implementing trace warping for electronic designs may determine an order of compression for the one or more pairs of matching simulation combinations and compress the plurality of clock cycles between the first clock cycles and the second clock cycle based in part or in whole upon the order of compression. In addition or in the alternative, a compressed transition may be identified in the trace display; and the compressed transition may be expanded or decompressed in implementing trace warping for electronic designs. In addition or in the alternative, an additional signal into the set of signals of interest may be interactively or incrementally introduced; and it may be determined whether the one or more pairs of matching combinations are to be revised based in part or in whole upon the additional signal.

In some of these aforementioned embodiments, the one or more pairs of matching simulation combinations may be modified into one or more modified pairs of matching simulation combinations based in part or in whole upon the additional signal when the one or more pairs of matching combinations are determined to be revised. In addition or in the alternative, one or more compressed transitions may be expanded or decompressed in the trace display; and compression for the range of clock cycles may be re-performed for at least one modified pair of the one or more modified pairs of matching simulation combinations.

Some embodiments are directed at an article of manufacture that includes a non-transitory machine-accessible storage medium having stored thereupon a sequence of instructions which, when executed by at least one micro-processor or at least one processor core, causes the at least one micro-processor or the at least one processor core to perform any of the methods, processes, or sub-processes disclosed herein. Some illustrative forms of the non-transitory machine-readable storage media may also be found in the System Architecture Overview section below.

More details of various aspects of the methods, systems, or articles of manufacture for implementing coplanar waveguide transmission lines in an electronic design are described below with reference to FIGS. 1-8.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIG. 4C illustrates a more detailed block diagram for local or global expansion of one or more compressed transitions due to a change in the state or functionality of a signal of interest in one or more embodiments.

FIG. 4F illustrates another more detailed block diagram for local or global expansion of one or more compressed transitions due to a change in the state or functionality of a signal of interest in one or more embodiments.

FIGS. 5A-G illustrate an example of trace warping for a simplified electronic design in one or more embodiments.

FIGS. 7A-C illustrate an example of implementing trace warping for electronic designs for a simplified electronic design in one or more embodiments.

DETAILED DESCRIPTION

Various embodiments are directed to a method, system, and computer program product for implementing trace warping for electronic designs. Other objects, features, and advantages of the invention are described in the detailed description, figures, and claims.

Various embodiments of the methods, systems, and articles of manufacture will now be described in detail with reference to the drawings, which are provided as illustrative examples of the invention so as to enable those skilled in the art to practice the invention. Notably, the figures and the examples below are not meant to limit the scope of various embodiments, unless otherwise specifically described in particular embodiment(s) or recited in the claim(s).

Where certain elements of embodiments may be partially or fully implemented using known components (or methods or processes), portions of such known components (or methods or processes) that are necessary for an understanding of the present invention will be described, and the detailed descriptions of other portions of such known components (or methods or processes) will be omitted for ease of explanation and to not obscure embodiments of the invention. Further, embodiments encompass present and future known equivalents to the components referred to herein by way of illustration. More details about various processes or modules to implement various embodiments are further described below with reference to FIGS. 1-5.

Figure 1:
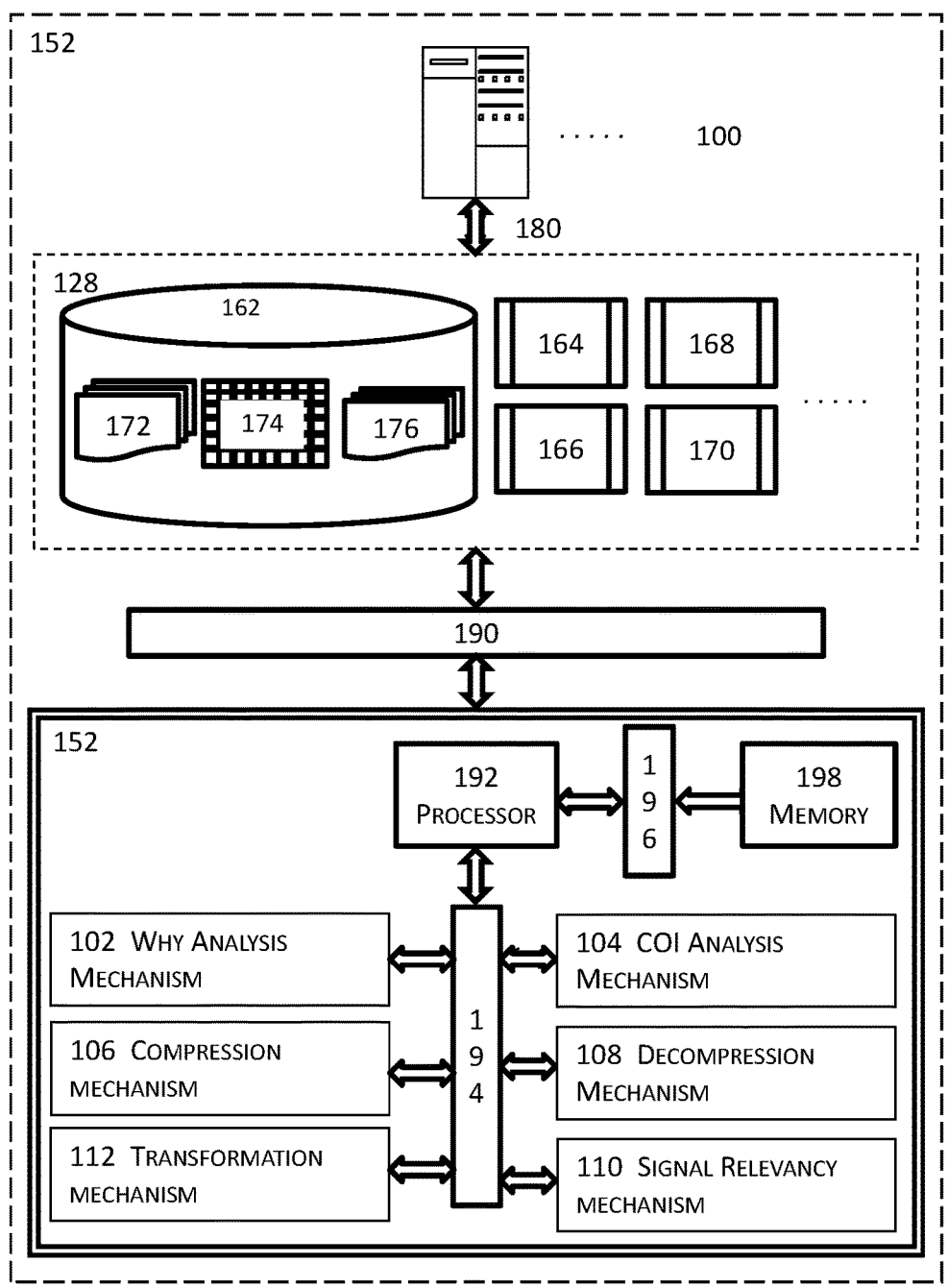
FIG. 1 illustrates a high level schematic block diagram for implementing trace warping for electronic designs in one or more embodiments.

FIG. 1 illustrates a high level schematic block diagrams for implementing trace warping for electronic designs in one or more embodiments. More specifically, FIG. 1 illustrates an illustrative high level schematic block diagrams for implementing trace warping for electronic designs and may comprise one or more computing systems 100, such as a general purpose computer described in the System Architecture Overview section to implement one or more special proposes.

In some embodiments, the one or more computing systems 100 may invoke various system resources such as the processor(s) or processor core(s), memory, disks, etc. The one or more computing systems 100 may also initiate or interact with other computing systems to access, via a computer bus architecture (e.g., a system bus, a control bus, a data bus, or any combinations thereof), various resources

128 that may comprise a floorplanner, a global routing engine, and/or a detail routing engine 164, a layout editor 166, a design rule checker 168, a verification engine 170, etc.

The one or more computing systems 100 may further write to and read from a local or remote non-transitory computer accessible storage 162 that stores thereupon data or information such as, but not limited to, one or more databases (174) such as schematic design database(s) or physical design database(s), electronic circuit design specification database(s), various statistics, various data, rule decks, various design rules, constraints, etc. (172), or other information or data (176) that may be used to facilitate the performance of various functions to achieve the intended purposes.

In some embodiments, the one or more computing systems 100 may include or, either directly or indirectly through the various resources 128, invoke a set of modules 152 including hardware modules and software modules or combinations of one or more hardware modules and one or more software modules. Each of these modules may include or function in tandem with electrical circuitry and one or more micro-processors each having one or more processor cores to perform its intended functions.

The hardware system may further include one or more forms of non-transitory machine-readable storage media or persistent storage devices to temporarily or persistently store various types of data or information, various design rules, various libraries, selected and selectable targets, or any other suitable information or data, etc. A module is initialized in a computing system so that the software portion of the module is stored in memory (e.g., random access memory) to be executed by one or more processors or processor cores off the computing system to perform at least a part of the functionality of the module. Some illustrative modules or components of the hardware system may be found in the System Architecture Overview section below.

The set of modules 152 may comprise a why analysis module 102 to one or more why analyses to identify relevant signals for one or more target simulation combinations (e.g., signal state identifications or signal state values in a particular clock cycle). The set of modules 152 may also include a cone of influence (COI) module 104 to perform one or more cone of influence analyses identify relevant signals for one or more target simulation combinations.

The set of modules 152 may further optionally include a compression module 106 to perform various tasks for compressing or compacting the clock cycles in a trace display. For example, the compression module 106 may determine an order of compression, whether a portion of a trace may be compressed, how a trace may be compressed, etc. in some embodiments. In addition or in the alternative, the set of modules 152 may include a decompression module 108 to perform various tasks for decompressing or expanding a compressed trace display. For example, the decompression module 108 may determine whether a compressed transition is to be decompressed, how much of a compressed transition is to be decompressed, how decompression is to be performed, etc.

The set of modules 152 may include a signal relevancy module 110 that functions in tandem with, for example, the why analysis module 102 and/or the COI analysis module 104 to identify one or more relevant signals, and/or a transformation module 112 to transform a simulation combination or a state identification (collectively simulation combination hereinafter) into one or more values for further operations or processing. In this application, a simulation combination, a state identification, or a mapped value thereof may be collectively referred to as a simulation combination hereinafter.

In some embodiments, the computing system 100 may include the various resources 128 such that these various resources may be invoked from within the computing system via a computer bus 180 (e.g., a data bus interfacing a microprocessor 192 and the non-transitory computer accessible storage medium 198 or a system bus 190 between a microprocessor 192 and one or more engines in the various resources 128). In some other embodiments, some or all of these various resources may be located remotely from the computing system 100 such that the computing system may access the some or all of these resources via a computer bus 180 and one or more network components.

The computing system may also include one or more modules in the set of modules 152. One or more modules in the set 152 may include or at least function in tandem with a microprocessor 192 via a computer bus 194 in some embodiments. In these embodiments, a single microprocessor 192 may be included in and thus shared among more than one module even when the computing system 100 includes only one microprocessor 192. A microprocessor 192 may further access some non-transitory memory 198 (e.g., random access memory or RAM) via a system bus 196 to read and/or write data during the microprocessor's execution of processes.

Figure 2:
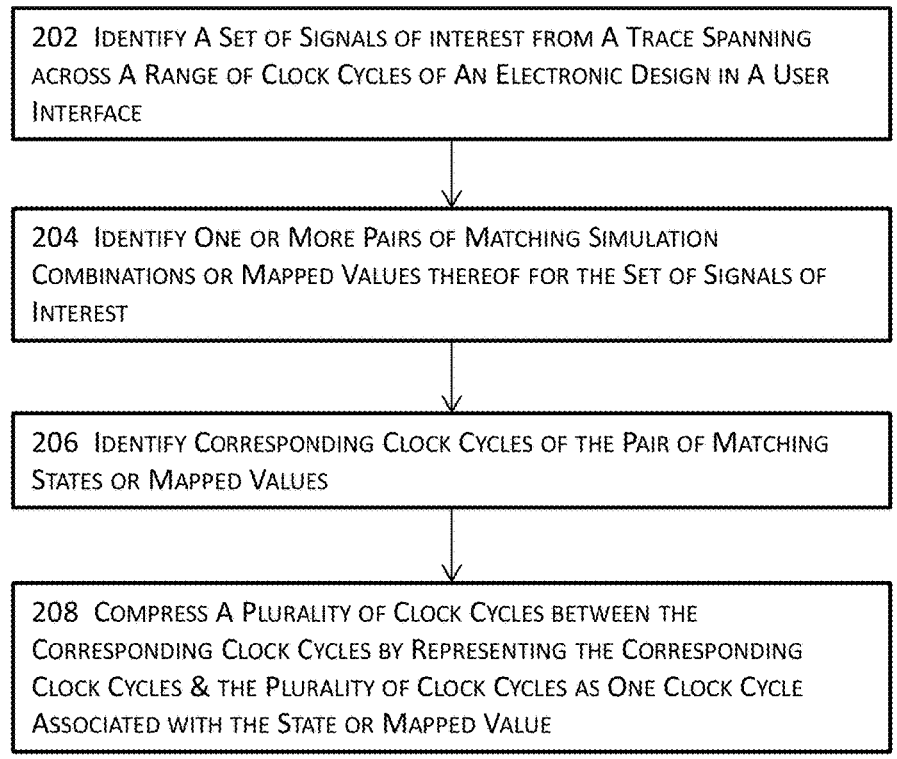
FIG. 2 illustrates a high block diagram for implementing trace warping for electronic designs in one or more embodiments.

FIG. 2 illustrates a high block diagram for implementing trace warping for electronic designs in one or more embodiments. A set of signals of interest may be identified at 202 from a trace that spans across a range of clock cycles of an electronic design. A particular clock cycle in the range of clock cycles may also be identified at 202 for the target signal.

In some embodiments, the set of signals of interest may include all signals of an electronic design. In some other embodiments, the set of signals of interest includes a smaller subset of all signals of an electronic design. For example, the set of signals of interest may include one or more relevant signals in some embodiments. Given the set of signals of interest identified at 202, one or more additional signals (e.g., a target, an additional relevant signal, etc.) may be further identified or extracted and added to the set of signals of interest to create a revised set of signals of interest in some of these embodiments. This "set of signals of interest" and/or the "revised set of signals of interest" may be maintained for the performance of trace warping. In some embodiments, a target includes a signal that reportedly exhibits a failure or issue in a particular clock cycle. For example, signal A at the 17,000-th clock cycle may be identified as a target and added to the set of signals of interest. A relevant signal includes a signal may be deemed relevant when the signal is determined to pertain to the behavior of one or more other signals or the behavior of the electronic circuit in some embodiments.

Whether a signal is relevant may be determined by, for example, a why analysis (e.g., one or more why operations performed by the why analysis module 102 in FIG. 1), a cone of influence analysis (e.g., one or more operations performed by the COI analysis module 104 in FIG. 1), a combination of a Why analysis and a COI analysis, or any other suitable analyses. A COI analysis may consider all fanin signals as relevant to the target. A why analysis may consider the values in these fanin signals and use only a smaller subset of signals as relevant signals. In some embodiments, a why analysis may, in response to a signal such as a target signal, invoke an analysis module (e.g., the why analysis module 102 in FIG. 1) to determine, for example, one or more expressions or other pertinent information that explains or provides circuit data (e.g., one or more transitions and/or states) that result in the particular value or state of the target signal at a specific time point. For example, with a=b & c, where a has value 0, b has value 0, and c has value 1, the signal b may be identified as a relevant signal while the signal c may be considered irrelevant, because a change in value c will not cause signal a to change value. The relevancy analysis may repeat the operations using one or more of the relevant signals extracted in the current iteration as the target for more why analysis or COI analysis. In some embodiments where all signals are deemed relevant and thus belong to the set of signals of interest at 202, the relevancy analysis (e.g., the Why analysis, COI analysis, etc.) is not needed or performed. In these one or more embodiments, a trace may include a simulation trace determined by one or more simulations or a formal trace determined by, for example, a verification engine 170 such as a formal proof engine.

In some embodiments, the set of signals of interest may be altered at any time by, for example, adding one or more signals to or removing one or more signals from the set at a time. In some embodiments where the set of signals include one or more relevant signals determined by, for example, one or more signal relevancy analysis (e.g., via COI or Why analysis), a modification to the set of signals of interest may trigger in some embodiments or may not trigger in some other embodiments, depending upon the configuration or settings, the signal relevancy analysis to determine whether one or more additional signals are now determined to be relevant and/or one or more existing signals are now determined to be removed from the set.

For an identified target signal in a particular clock cycle, a signal relevancy analysis may identify one or more signals in one or more clock cycles that precede the particular clock cycle. These one or more signals may be determined, from the signal relevancy analysis, to be relevant to the characteristics of the target signal in the particular clock cycle. For example, a target signal A in the 17,000-th clock cycle may be identified as the target signal; and a signal relevancy analysis may identify signal B in the 16,999-th clock cycle, signal C in the 16,999-th clock cycle, signal D in the 16,998-th clock cycle, and signal E in the 16,997-th cycle as the relevant signals. These one or more relevant signals may be added to the set of signals of interest at 202.

In some embodiments, modifications to the set of signals of interest may be performed incrementally. For example, a verification engineer may start with a set of signals of interest and add one additional signal to the set of signals of interest. With the addition of this additional signal, a signal relevancy analysis may be triggered to determine whether one or more other signals are now determined to be relevant and thus are to be added to the set of signals of interest. In addition or in the alternative, the signal relevancy analysis may determine whether one or more existing signals of interest are now determined to be irrelevant and are thus to be removed from the set of signals of interest.

In these embodiments, a modification to the set of signals of interest may trigger not only the signal relevancy analysis but also the subsequent acts such as the identification of one or more pairs of matching simulation combinations at 204, the identification of clock cycles corresponding to the one or more pairs of matching simulation combinations at 206, and/or the compression and/or decompression of clock cycles at 208. Even in some embodiments where the set of signals of interest include all signals, this set of signals of interest may still be modified by, for example, removing one or more existing signals of interest from consideration.

One or more pairs of matching states or one or more mapped values thereof may be determined at 204 for the set of signals of interest. In some of these embodiments, the corresponding clock cycles for these one or more matching states may also be identified at 204. A simulation combination may include the values or states of signals in the set of signals of interest and the value or state of the target signal identified at 202. For example, for a set of signals of interest comprising signals A, B, and C, a first simulation combination in a first clock cycle may be {0, 1, 1}. If a second simulation combination having the signal values or states {0, 1, 1} in a second clock cycle, the first simulation combination and the second simulation combination are determined to be a pair of matching combinations.

In some embodiments, the techniques described herein may examine a transformed value of a simulation combination, rather than the simulation combination itself. For example, a counter value corresponding to a clock cycle may be determined for the signal values or states of that clock cycle for an electronic design (e.g., a FIFO buffer). In this example, one or more pairs of matching counter values, rather than the corresponding one or more pairs of matching simulation combinations, may be determined at 204. As another example, a hash value corresponding to the signal values or states in a clock cycle may be determined for the signal values or states of that clock cycle for an electronic design. In this example, one or more pairs of matching hash values, rather than the corresponding one or more pairs of matching simulation combinations, may be determined at 204.

At 206, the clock cycles that correspond to the one or more pairs of matching simulation combinations or one or more pairs of matching mapped values may be identified from the range of clock cycles. A simulation combination includes a set of one or more signal or state values in a particular clock cycle for the set of signals of interest and may be obtained by, for example, simulations, formal verifications, etc. For example, a first simulation combination for signals of interest A, B, C, D respectively having their signal values or state values "1", "0", "0", and "1" in the, for example, 25,000-th clock cycle may be expressed as {1, 0, 0, 1}. A pair of matching simulation combinations includes two simulation combinations for the set of signals of interest at two different clock cycles. In the above example, the first simulation combination is deemed to be in a pair of matching with a second simulation combination {1, 0, 0, 1} in the, for example, 12,000-th clock cycle.

In some embodiments, rather than identifying simulation combinations and then one or more matching pairs of simulation combinations, a single value for each clock cycle may be identified, and identifying a matching pair of simulation combinations may thus amount to, for example, identifying a matching pair of numbers. For example, when the electronic design is a first-in-first-out (FIFO) buffer including a counter, the a counter value may be used for each clock cycle, and identifying a pair of matching simulation combinations may be reduced to a simpler task of identifying a pair of matching counter values in two clock cycles such as the examples illustrated in FIGS. 5A-G.

Figure 5A:
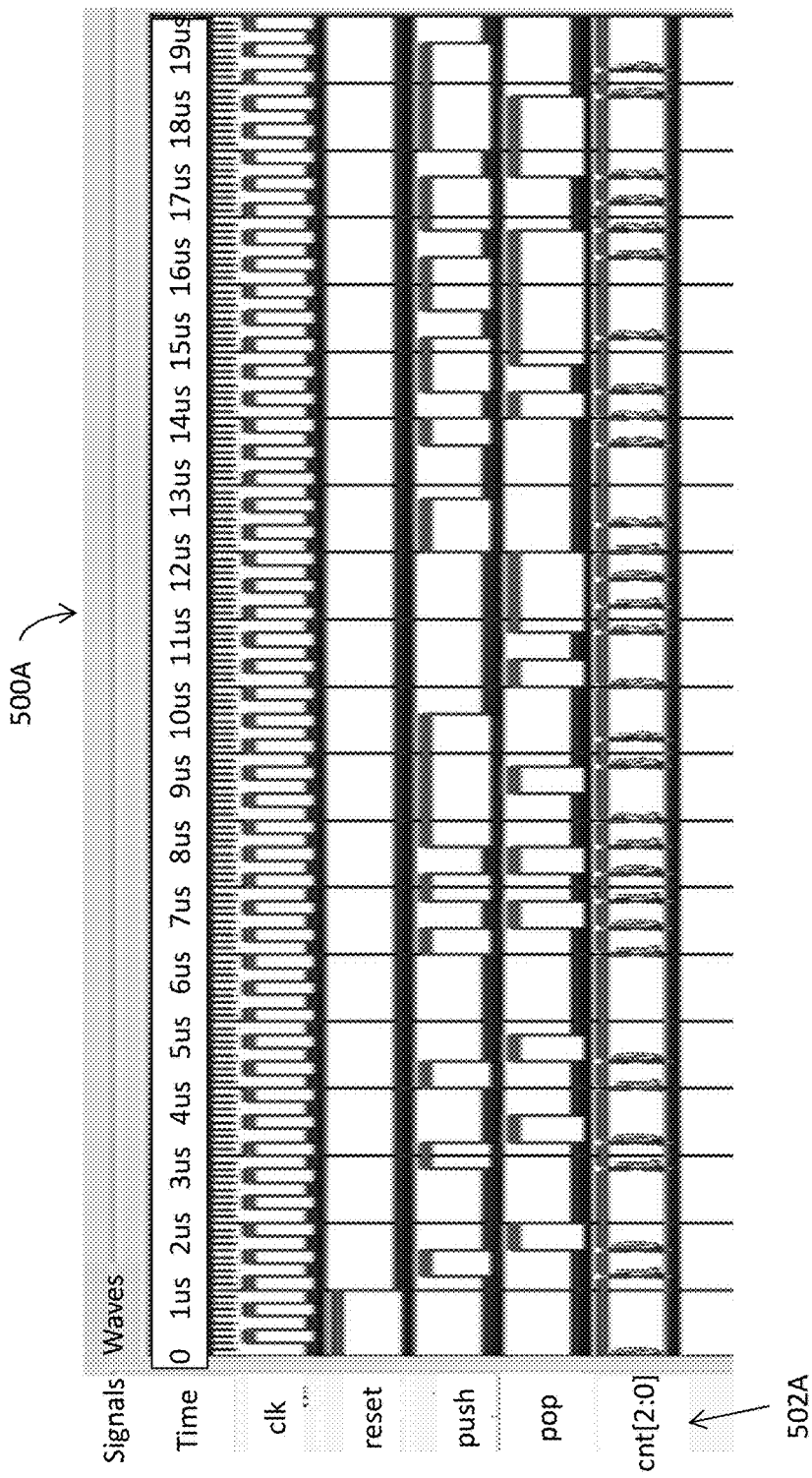
Figure 5B:
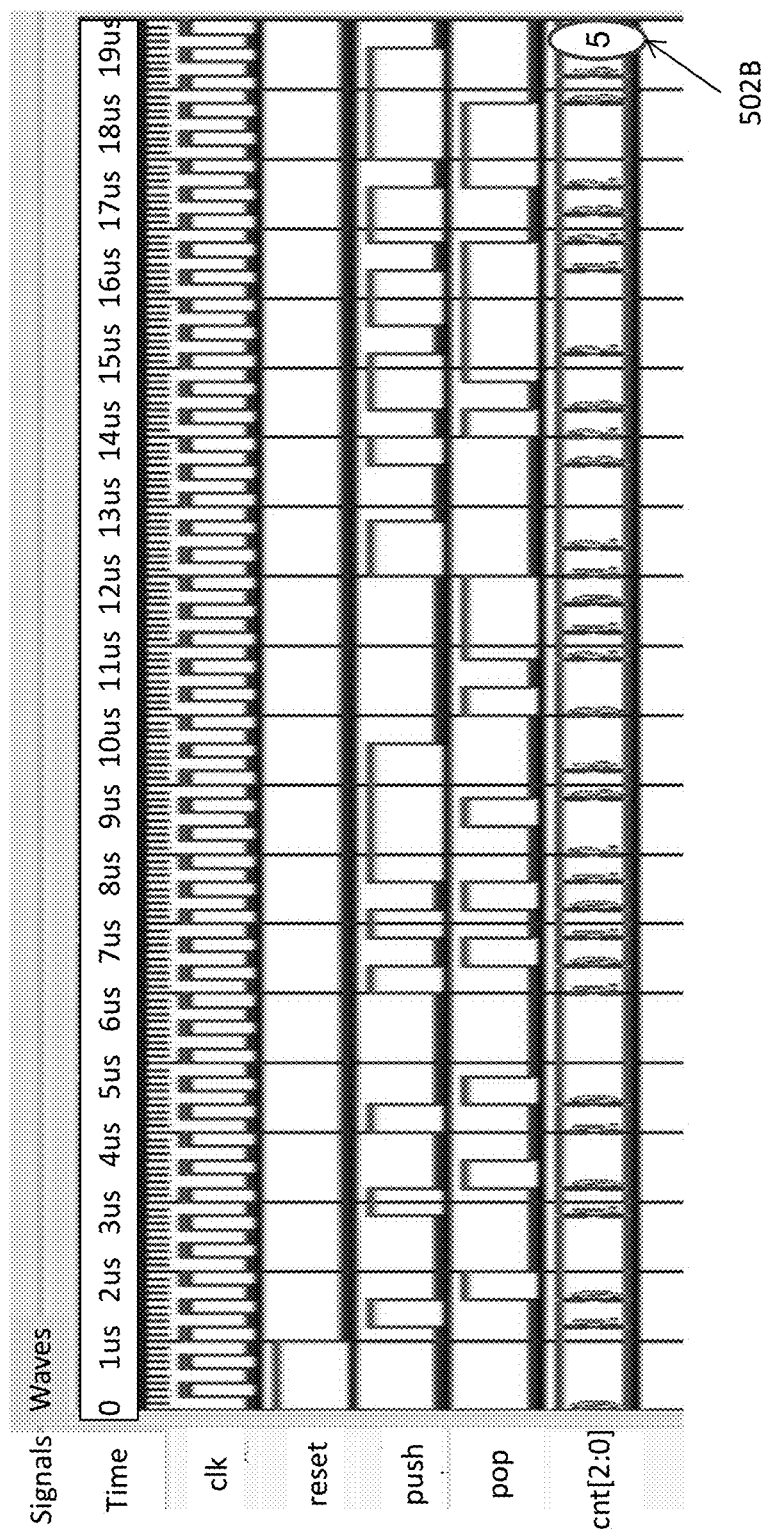

In these examples illustrated in FIGS. 5A-G, FIG. 5A illustrate a trace display 500A and a set of signals of interest 502A plotted against a range of clock cycles. FIG. 5B illustrates the identification of a counter value "5" 502B in a particular clock cycle. In this example, no other clock cycles correspond to a counter value of "5", and thus no pairs of matching "simulation combinations" corresponding to the counter value "5" is identified.

Figure 5C:
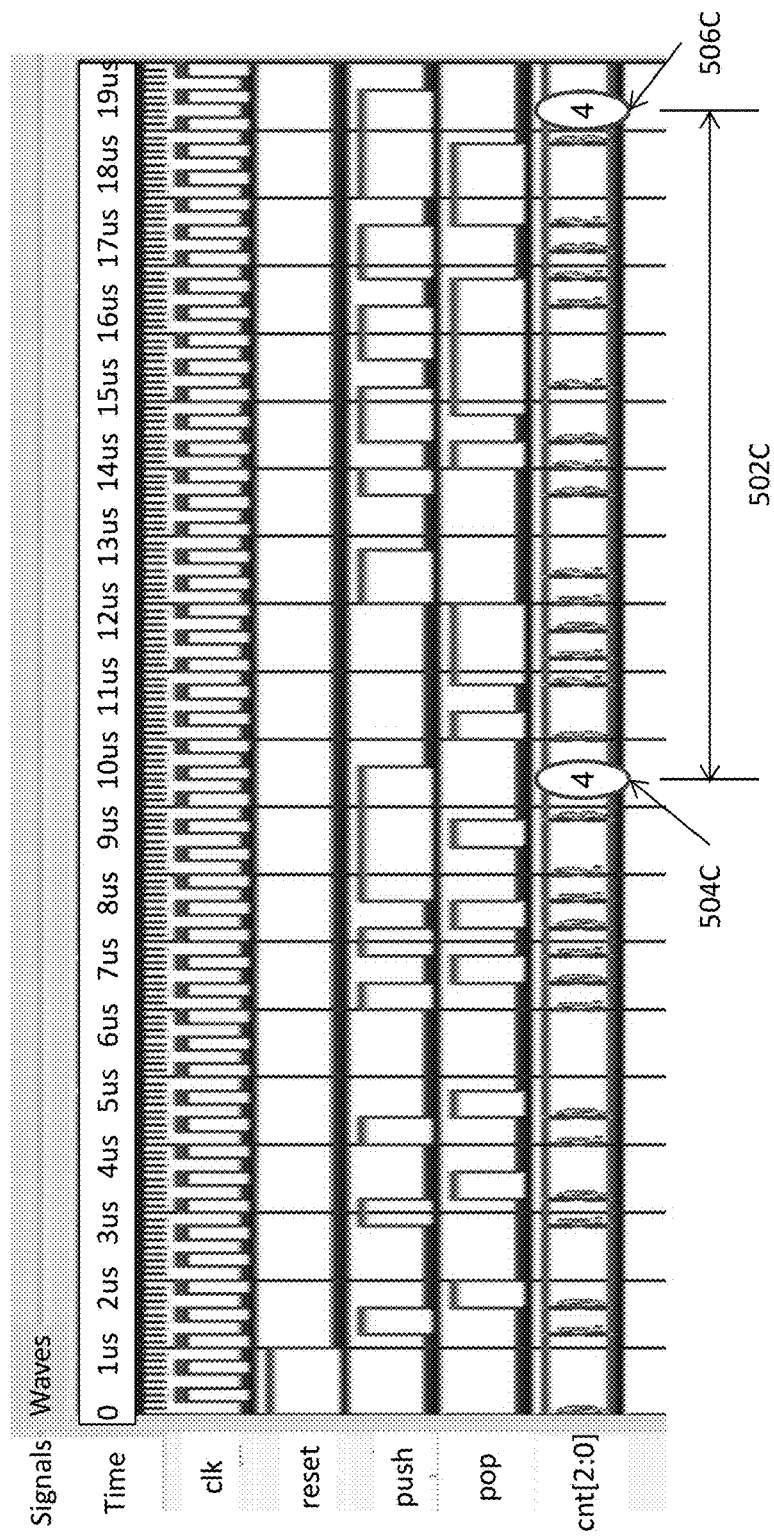

In FIG. 5C, two clock cycles 504C and 506C correspond to the counter value "4". Therefore, exactly one pair of matching "simulation combinations" is identified for the counter value "4". In FIG. 5D, six clock cycles correspond to the counter value "3" in the trace display, and thus multiple pairs ($C_2^6$ or 15) of matching "simulation combinations" may be identified for the counter value "3". In FIG. 5E, seven clock cycles correspond to the counter value "2" in the trace display, and thus multiple pairs ($C_2^7$ or 21) of matching "simulation combinations" may be identified for the counter value "2".

Figure 5F:
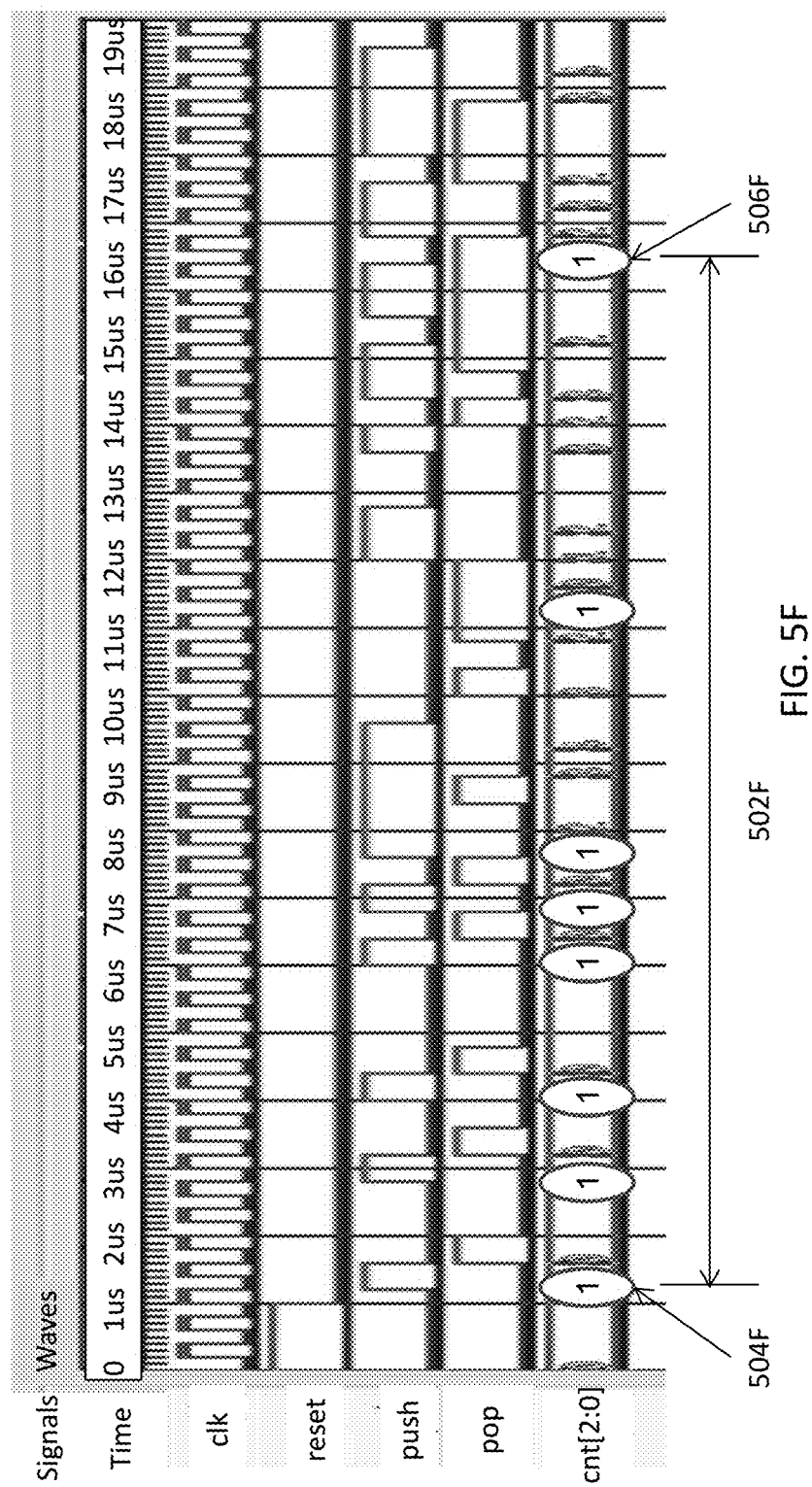

In FIG. 5F, eight clock cycles correspond to the counter value "1" in the trace display, and thus multiple pairs ($C_2^8$ or 28) of matching "simulation combinations" may be identified for the counter value "1". In FIG. 5G, seven clock cycles correspond to the counter value "0" in the trace display, and thus multiple pairs ($C_2^7$ or 21) of matching "simulation combinations" may be identified for the counter value "0". In some other embodiments, other numbers may be used to represent the signal values or states. For example, the signal values or states for a clock cycle may be transformed to a value for the clock cycle. In the aforementioned example, the simulation combination {1, 0, 0, 1} may be hashed by using a hash function into a hash value. In this example, identifying a pair of matching simulation combinations may amount to identifying a pair of matching hash values.

At 208, a plurality of cycles in the trace display may be compressed between the corresponding clock cycles of a pair of matching simulation combinations. In some embodiments, the plurality of cycles for compression may be determined based in part or in whole upon one or more criteria. The one or more criteria may include, for example, an order or priority of compression, the nature or type of signals, the number of clock cycles in a pair of matching simulation combinations, the nature or intended function(s) of the electronic circuit design, etc. For example, a first pair of matching simulation combinations that span across a relatively larger number of clock cycles may be compressed prior to a second pair of matching simulation combinations that span across a relatively smaller number of clock cycles.

Figure 3A:
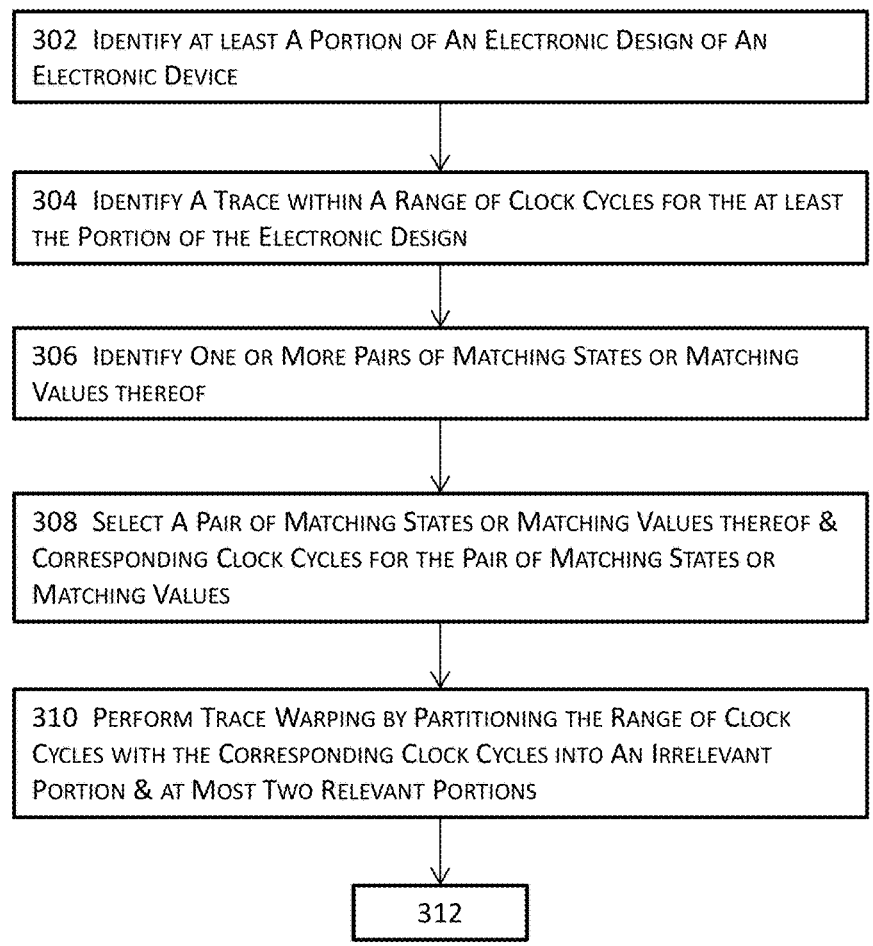
FIGS. 3A-B jointly illustrate a more detailed block diagram for implementing trace warping for electronic designs in one or more embodiments.
Figure 3B:
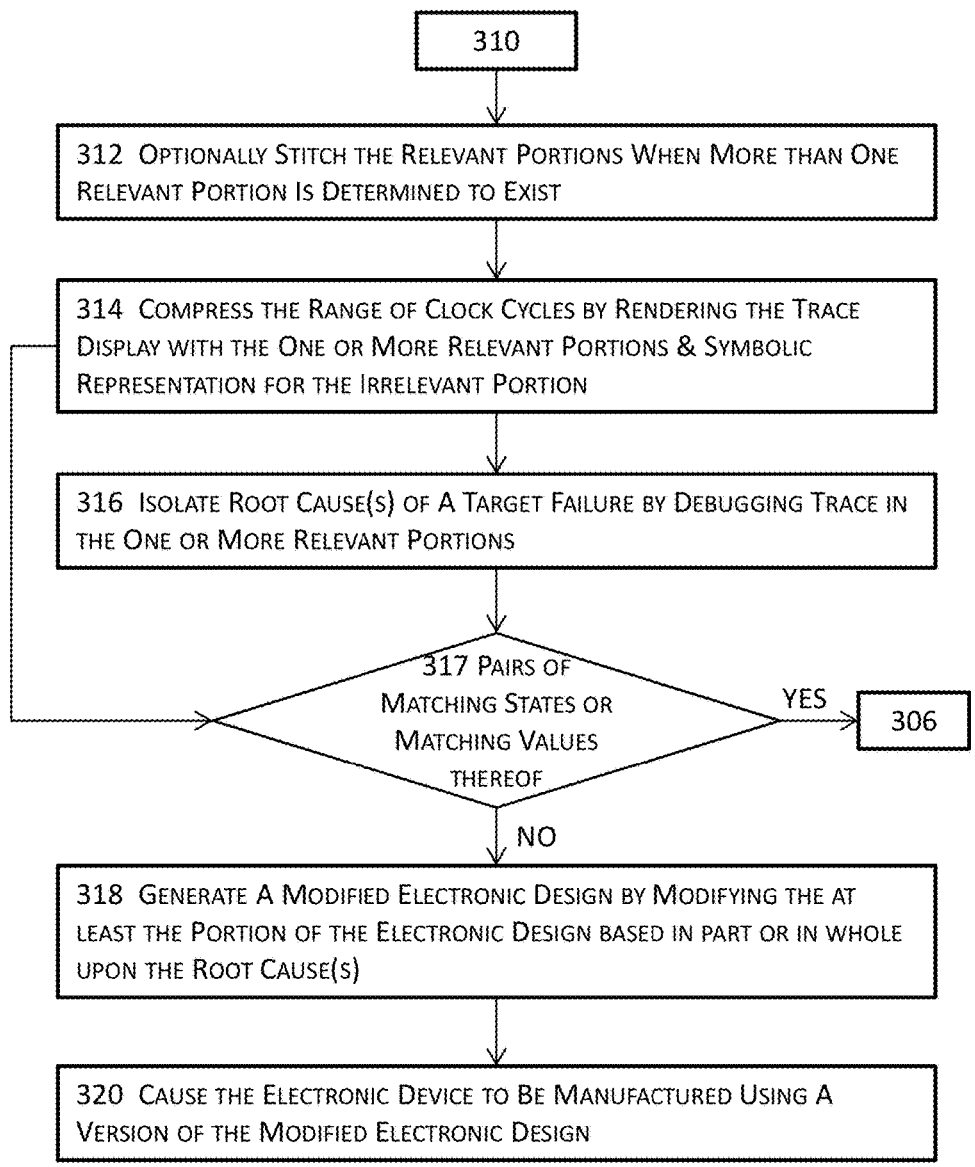

FIGS. 3A-B jointly illustrate a more detailed block diagram for implementing trace warping for electronic designs in one or more embodiments. More specifically, FIG. 3A-B jointly illustrate a block diagram for implementing all signal trace warping in these one or more embodiments. At 302, at least a portion of an electronic design of an electronic device may be identified at 302. A trace within a range of clock cycles may be identified at 304 for the at least the portion of the electronic design.

A trace may include a waveform (or trace) display of a signal and may be determined from, for example, one or more simulations, verifications (e.g., formal verification, etc.), or any other suitable analyses. One or more pairs of matching simulation combinations (e.g., signal states, signal values, etc. for two clock cycles) of all signals in the range of clock cycles or matching values thereof may be identified at 306. In these embodiments illustrated in FIGS. 3A-B, all signals are considered, and thus a perfect match between the simulation combinations of the at least the portion of the electronic design in two clock cycles is sought at 304.

In some embodiments where matching simulation combinations between two clock cycles are to be identified, a first simulation combination may be first identified, and the matching, second simulation combination may be identified by forward or backward traversing the along the temporal axis. A pair of matching simulation combinations and the corresponding clock cycles may be selected at 308. The clock cycles within the two clock cycles may form the target for compression. In some embodiments, the clock cycles including the largest number of clock cycles may be selected at 308. Trace warping may be performed at 310 by partitioning the trace including the range of clock cycles with the corresponding cycles into an irrelevant portion and at most two relevant portions. For example, a trace may be partitioned into an irrelevant portion bound by the range of clock cycles while the remainder of the trace (e.g., no more than two trace segments along the trace) stays as relevant.

The portion included between the first clock cycle and the second clock cycle of a pair of matching simulation combinations may be categorized as an irrelevant portion based on the premise, observation, or theory that the portion of the electronic design identified at 302 is in a first state in the first clock cycle, proceeds through a series of state changes, and eventually go back to the same state (and hence "matching simulation combinations") in the second clock cycle. If this portion between the first and second clock cycles does not include any errors or states of interest, this portion may be safely deemed irrelevant to the analyses at hand.

The remaining portion(s) of the trace may be considered relevant at the moment or until the remaining portion(s) is (are) determined to be irrelevant (e.g., being included in part or in whole in one or more pairs of matching simulation combinations). In some embodiments where the trace includes multiple relevant portions, these multiple relevant portions may be optionally stitched at 312. In some embodiments, such stitching operation may be included as a part of compressing the trace or the range of clock cycles. The trace or the range of clock cycles included therein may be compressed by rendering the trace display with the one or more relevant portions at 314. In some of these embodiments, the flow illustrated in FIGS. 3A-B may return from 314 back to 306 to identify one or more additional pairs of matching states or matching values thereof when it is determined that there still exist one or more pairs of matching states or matching values thereof at 317. Another pair of matching states or matching values thereof as well as the corresponding clock cycles may then be selected again at 308. The range of clock cycles may then be further partitioned at 310 into an irrelevant portion and one or more relevant portions for additional trace warping implementation. The process flow illustrated in FIGS. 3A-B may thus repeat the acts 306 through 314 until all pairs of matching states or values thereof have been similarly processed and then proceed to 318.

In some embodiments, compressing the trace display or the range of clock cycles may including collapsing a portion of the trace display (e.g., between a first clock cycle and a second clock cycle) into a smaller portion (e.g., a line segment, a narrower portion, etc.) in the trace display. In some of these embodiments, one or more symbolic representations may also be presented in the trace display to indicate the compressed trace or clock cycles for the corresponding one or more irrelevant portions at 314. In the example illustrated in FIG. 7B, a symbolic representation 706B may be added to the trace display to indicate that a portion (e.g., an irrelevant portion) of clock cycles (and hence the corresponding waveforms) has been compressed in the trace display.

A symbolic representation thus indicates a compressed transition in states for the portion of the electronic design identified at 302. A compressed transition includes a transition of the portion of the electronic design from one state in a clock cycle to another state in another clock cycle, while the trace display between these two clock cycles is textually and/or graphically de-emphasized, suppressed, collapsed, or hidden. A compressed portion of the trace or the range of clock cycle may be expandable or de-compressible automatically (e.g., after introduction of a new signal that cause a compressed transition to be expanded) or manually by a user.

One or more root causes or possible causes for the target failure corresponding to the target signal may be isolated at 316 by debugging the trace in the one or more relevant portions. These one or more root causes or possible causes may be emphasized with textual and/or graphical emphasis in the trace in some of these embodiments for easy recognition and/or user manipulation. In some of these embodiments where it is determined that there still exist one or more pairs of matching states or matching values thereof at 317, the flow illustrated in FIGS. 3A-B may return from 316 back to 306 to identify one or more additional pairs of matching states or matching values thereof. Another pair of matching states or matching values thereof as well as the corresponding clock cycles may then be selected again at 308. The range of clock cycles may then be further partitioned at 310 into an irrelevant portion and one or more relevant portions for additional trace warping implementation. The process illustrated in FIGS. 3A-B may thus repeat from 306 to 316 one or more stopping criteria have been satisfied in some embodiments. On the other hand, if the determination at 317 is negative, the process may proceed to 318. For example, the process may proceed to 318 when no more pairs of matching states or matching values may be identified, when no further root causes of the target failure may be identified, when the range of clock cycles may no longer be partitioned, when a prescribed stopping criterion is reached, or any other suitable criteria. With the one or more root causes or possible causes identified at 316, the portion of the electronic design or other portion thereof may be modified at 318 based in part or in whole upon the one or more root or possible causes; and the modified electronic design may be forwarded to an IC fabrication house or a foundry to cause the underlying electronic device to be fabricated at 320.

Figure 4A:
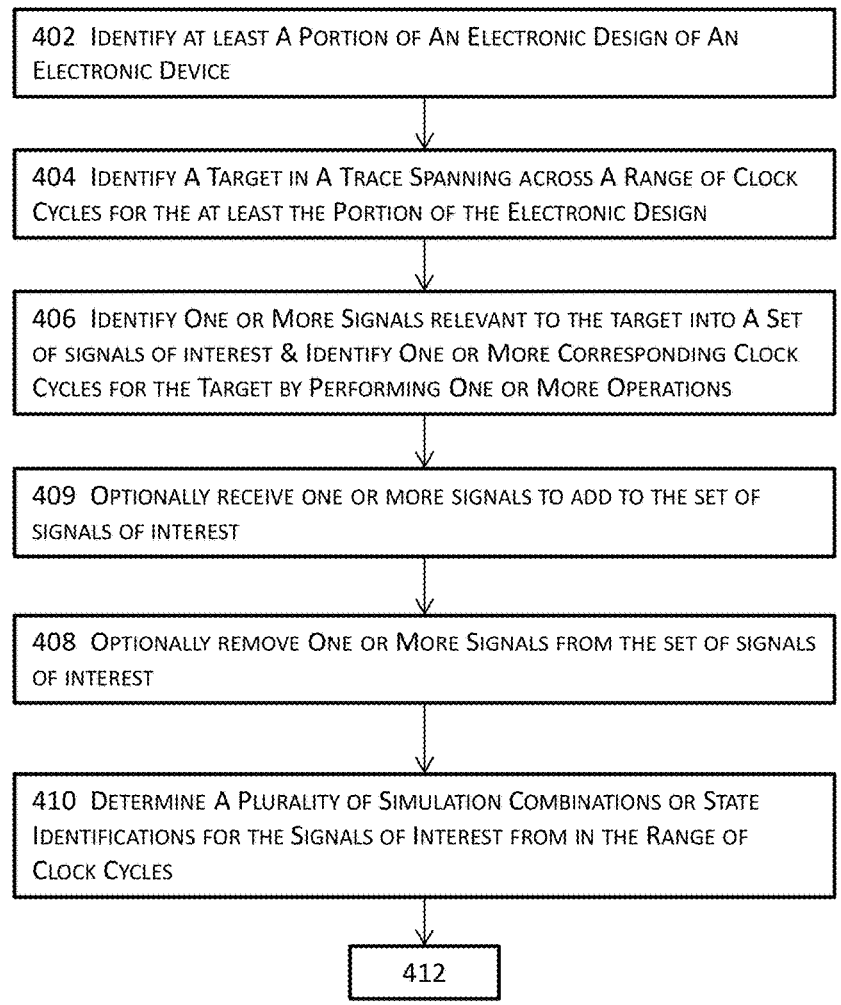
FIGS. 4A-B jointly illustrate a more detailed block diagram for implementing trace warping for electronic designs in one or more embodiments.
Figure 4B:
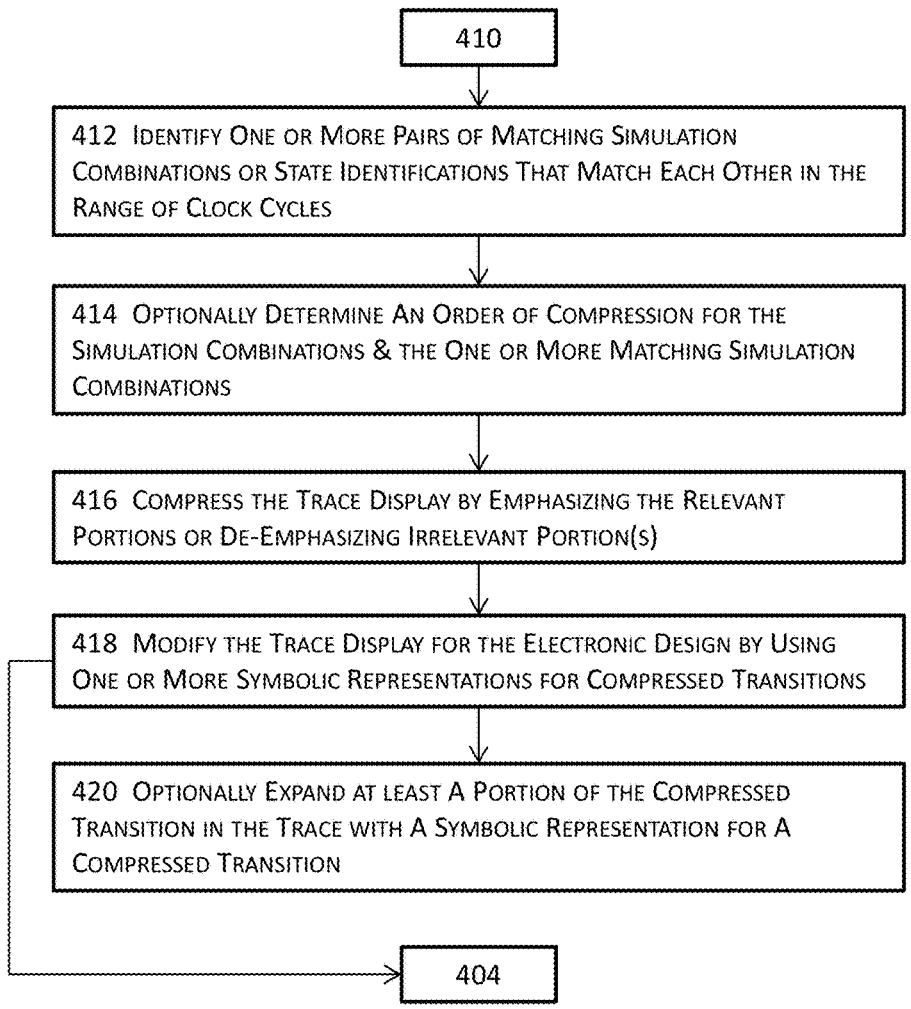

FIGS. 4A-B jointly illustrate a more detailed block diagram for implementing trace warping for electronic designs in one or more embodiments. More specifically, FIGS. 4A-B jointly illustrate a more detailed block diagram for a set of relevant signals identified by one or more signal relevancy analyses. This set of relevant signals may form or be added to a set of signals of interest for trace warping. In these one or more embodiments, at least a portion of an electronic design of an electronic device may be identified at 402; and a target (e.g., a target signal in a particular clock cycle) may be identified at 404 from a trace spanning across a range of clock cycles for the at least the portion of the electronic design.

In some embodiments, the at least the portion of the electronic design identified at 402 may belong to the same clock domain. In some other embodiments, the at least the portion of the electronic design may include multiple clock domains. In these latter embodiments, the fastest clock speed may be used for subsequent processing in order to provide sufficient resolution for the signals of interest under consideration although slower clock speed may also be selected for the trace. A target signal selected at 404 may include, for example, a failure of a particular signal of interest in a specific clock cycle.

One or more signals that are relevant to the target identified at 404 and one or more corresponding clock cycles for the target signal may be identified at 406 by performing one or more signal relevancy analyses (e.g., one or more why analyses, one or more COI analyses, or a combination of one or more why analyses and one or more COI analyses. These one or more signals may be captured and added into a set of signals of interest in some embodiments. The set of signals of interest may also include the target signals identified at 404. One or more additional signals may also be optionally identified into the set of signals of interest at 409. For example, for example, a user or an EDA (electronic design automation) tool may identify an additional signal into the set of signals of interest for various purposes (e.g., verification, debugging, etc.) With this introduction of an additional signal in the set of signals of interest, matching simulation combinations may be affected, and the trace display may also be affected as a result. One or more signals of the at least the portion of the electronic design may be optionally removed at 408 from the set of signals of interest.

These set of signals of interest including the target signal identified at 404 and the one or more signals identified at 406 in some embodiments. In some other embodiments, the set of signals of interest may include all signals of the at least the portion of the electronic design or the entire electronic design. At 410, a plurality of simulation combinations or state identifications (e.g., a counter value, a transformed value such as a hash value of the state values) therefor may be determined for the set of signals of interest in the range of clock cycles.

With the simulation combination or state identification identified at 410, one or more pairs of matching simulation combinations or state identifications that match each other may be identified at 412 in the range of clock cycles. In some embodiments, the techniques described herein identify all the possible pairs of matching simulation combinations or state identifications in the range of clock cycle, without identifying any particular simulation combination or state identification. A pair of matching simulation combinations or state identifications may be identified by identifying a first simulation combination or state identification and then traverse the plurality of simulation combinations or state identifications forward or backward to identify one or more simulation combinations or state identifications that match the first simulation combination or state identification. In some embodiments where signal values or states are used in the determination of matching simulation combinations or state identifications, these techniques described herein are to identify one or more pairs of signals to be added to or removed from the set of signals of interests. Once the signals of interest are identified or modified, the different clock cycles that exhibit the same signal values or states may be determined with respect to the set of signals of interest.

In some embodiments where signal values or states are transformed (e.g., transformed by using a hash function) in the determination of matching simulation combinations or state identifications, these techniques described herein are to identify one or more pairs of clock cycles that correspond to the same transformed value (e.g., a hash value). In some embodiments where a signal is selected for identifying matching simulation combinations or state identifications, these techniques described herein are to identify one or more pairs of clock cycles that correspond to the same signal value (e.g., a counter value).

An order of compression may be optionally determined at 414. For example, an order of compression may assign a higher priority or order to compress a pair of matching simulation combinations or state identifications that correspond to a larger number of clock cycles. In this example, a pair of matching simulation combinations or state identifications that correspond to a larger number of clock cycles may be first compressed before other matching simulation combinations or state identifications corresponding to smaller number of clock cycles are compressed.

Figure 4D:
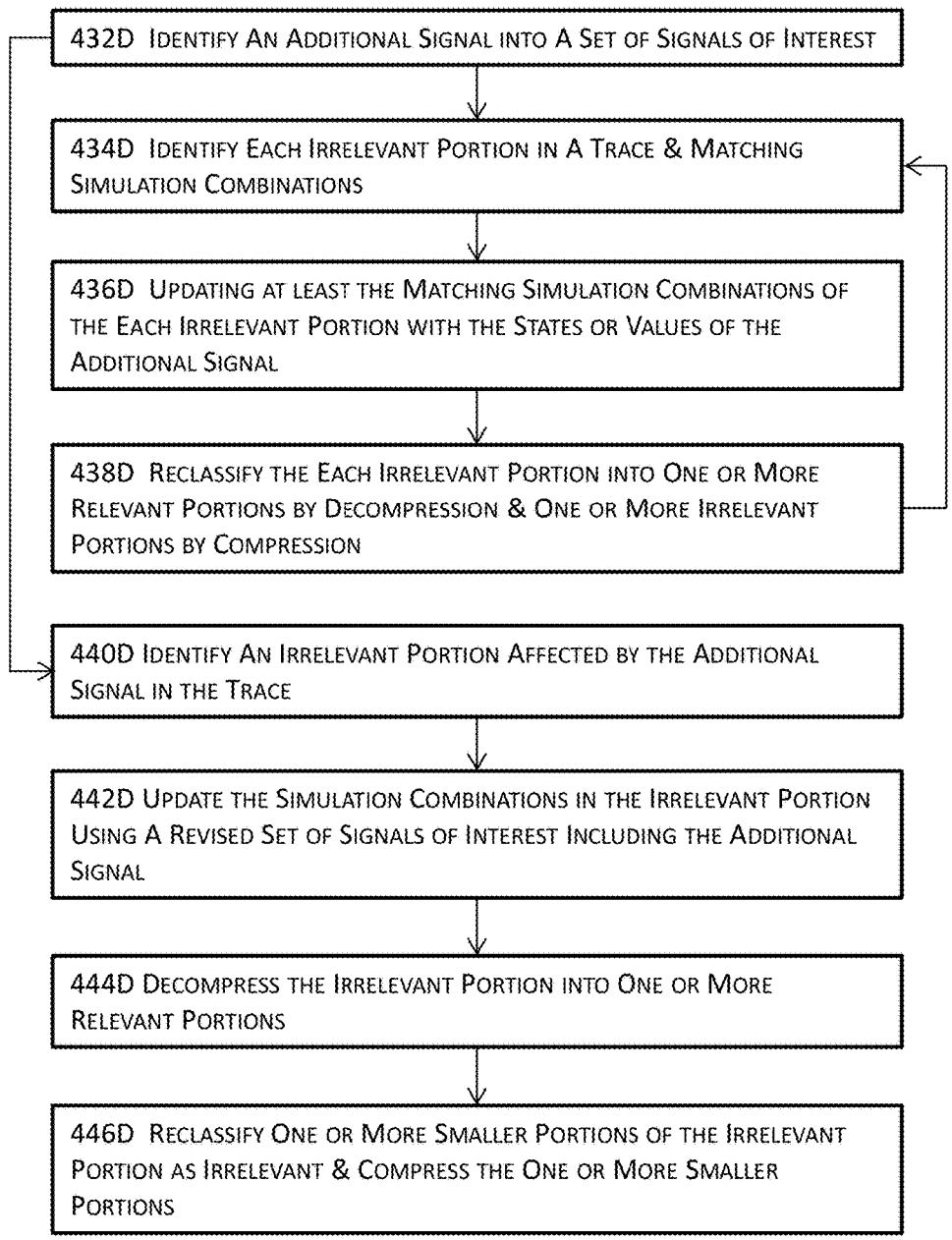
FIG. 4D illustrates a more detailed block diagram for local or global compression and decompression of a trace due to an addition a signal of interest in one or more embodiments.
Figure 4E:
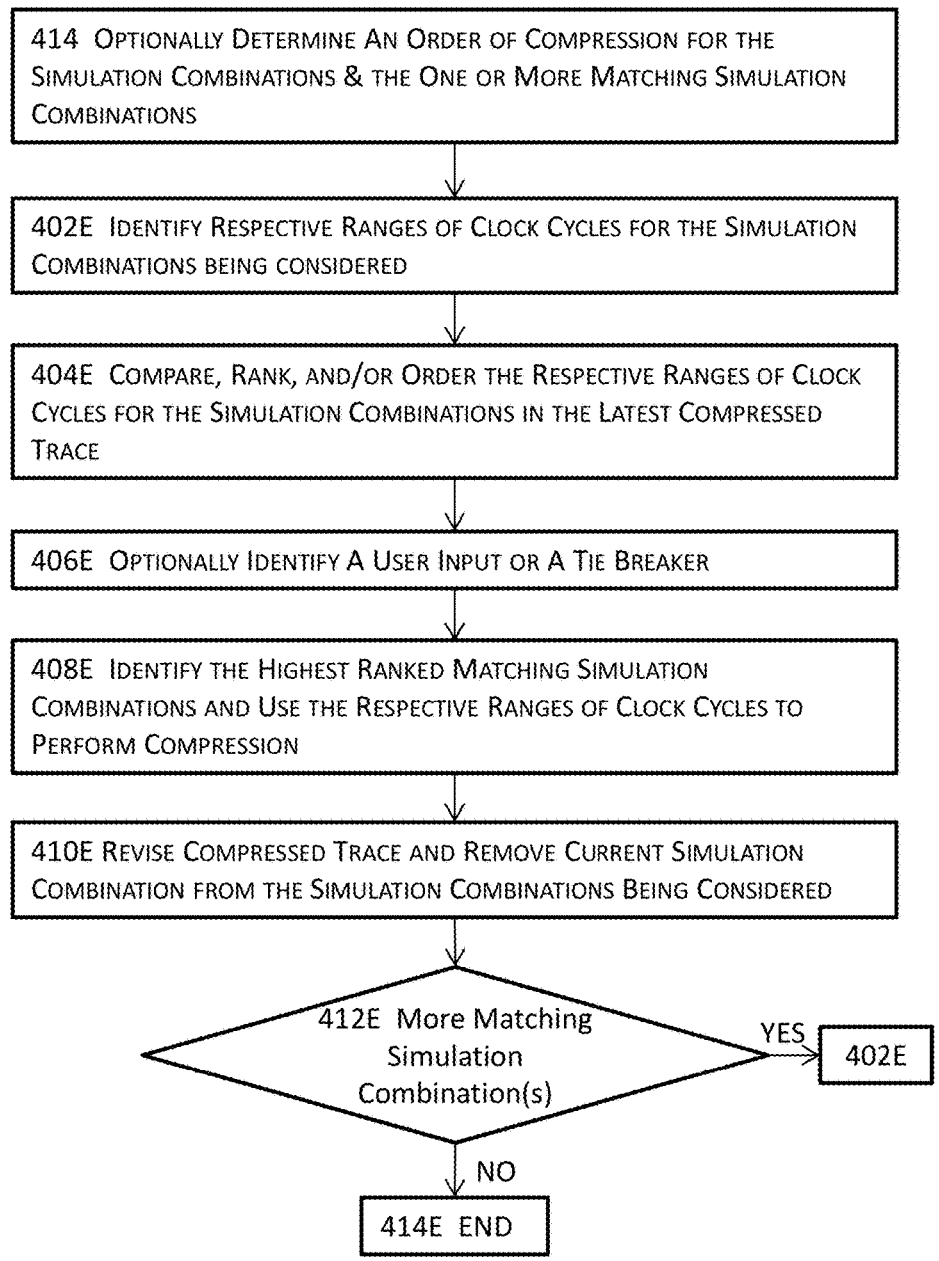
FIG. 4E illustrates a more detailed block diagram for determining a compression order for trace warping implementations in one or more embodiments.

Referring to FIG. 4E which illustrates a more detailed block diagram for determining a compression order for trace warping implementations in one or more embodiments. In these one or more embodiments where a plurality of pairs of simulation combinations are identified, the respective ranges of clocks for the plurality of pairs of simulation combinations may be identified at 402E. For example, the first pair of simulation combinations may correspond to the first range of 17,000$^{th}$-17,800-th clock cycles; the second pair of simulation combinations may correspond to the first range of 19,200$^{th}$-20,100-th clock cycles; and the third pair of simulation combinations may correspond to the first range of 25,800$^{th}$-27,100-th clock cycles in an example including three pairs of matching simulation combinations.

The respective ranges of clock cycles for the plurality of pairs of simulation combinations in the latest compressed trace may be compared, ranked, and/or ordered at 404E. In the above example including three pairs of matching simulation combinations, the first pair corresponds to 801 clock cycles; the second pair corresponds to 901 clock cycles; and the third pair corresponds to 1,301 clock cycles. As a result, these three pairs may be ranked, ordered, or compared based in part or in whole upon the total number of clock cycles in each range at 404E. It shall be noted that the comparison, ordering, or ranking of the plurality of pairs of matching simulation combinations may be based further upon one or more other criteria, in addition to or instead of the total number of clock cycles as illustrated in the aforementioned example. For example, the comparison, ordering, or ranking may be based on one or more functional aspects of the electronic design under consideration, one or more structural aspects of the electronic design under consideration, the types of signals of interest, any combinations thereof, or any other suitable criteria in addition to or instead of the total number of clock cycles illustrated in this example.

A user input and/or a tie breaker may be identified at 406E. For example, when the total numbers of clock cycles corresponding to two pairs of matching simulation combinations are identical or sufficiently close to each other (e.g., within a prescribed limit), both pairs may be presented in a user interface for the user to choose or decide whether one of the two pairs is to be assigned a higher compression order, or whether both pairs are to be assigned an equal compression order in some embodiments. The techniques described herein may also identify a tie breaker in these embodiments to automatically determine appropriate compression order for multiple pairs of matching simulation combinations that have, for example, identical or sufficient close total numbers of clock cycles.

A tie breaker may include, for example, functional analysis results of the electronic design under consideration, structural analysis results of the electronic design under consideration, types of signals, types or intended purposes of the electronic design under consideration, operating characteristics of the electronic design under consideration, any combinations thereof, or any other suitable factors that may serve as a tie breaker. The order of compression for the plurality of pairs of matching simulation combinations may then be determined at 408D based in part or in whole upon the results of comparison, ranking, and/or ordering, the user input, and/or the tie breaker in some embodiments.

In some embodiments, the highest ranked matching simulation combinations may be identified at 408E, and the respective ranges of clock cycles of the highest ranked matching simulation combinations may be used to compress the trace in an identical or substantially manner as those described above with reference to FIGS. 2, 3A-B, and 4A-C. The compressed trace may be revised, and the current simulation combination may be removed from the simulation combinations being considered at 410E. The process may return from 410E back to 402E to identify another set of respective ranges of clock cycles corresponding to another matching simulation combinations and repeat some or all of the acts 402E through 410E until it is determined at 412E that all matching simulation combinations have been processed. When it is determined at 412E that all matching simulation combinations have been processed, the process illustrated in FIG. 4E may terminate at 414E.

The trace display including, for example, the clock cycles, one or more waveforms or traces of the set of signals of interest, etc. may be compressed at 416. For example, one or more relevant portions of the portion of the trace display may be identified and emphasized in the trace display in some embodiments. One or more irrelevant portions of the trace display may also be identified and de-emphasized in the trace display in some other embodiments. In these latter embodiments, the one or more irrelevant portions may be textually and/or graphically de-emphasized, suppressed, collapsed, or hidden from display.

In addition or in the alternative, textually and/or graphically de-emphasizing, suppressing, collapsing, or hiding an irrelevant portion from display may be reversed in that the irrelevant portion may be subsequently expanded or decompressed to be displayed in the same manner as a relevant portion. At 418, the trace display for the at least the portion of the electronic design may be modified with one or more symbolic representations for one or more compressed transitions. A compressed transition includes a transition of the portion of the electronic design from one state in a clock cycle to another state in another clock cycle, while the trace display between these two clock cycles is textually and/or graphically de-emphasized, suppressed, collapsed, or hidden. A compressed transition in the trace display may be optionally expanded at 420 automatically in some embodiments due to, for example, a change in the relevant signals (e.g., due to the addition of an additional signal, the removal of an existing relevant signal, etc.) or manually by a user (e.g., by clicking on a compressed transition).

In some other embodiments, the process illustrated in FIGS. 4A-B may optionally return from 418 back to 404 to, for example, identify one or more additional targets and repeat the acts in 404 through 418. For example, one or more additional relevant signals may be further identified at 406 for the one or more additional targets identified at 404 in some embodiments. In some other embodiments, one or more existing relevant signals may be removed from the set of signals of interest due to the addition of the one or more targets as these one or more existing relevant signals may no longer be relevant. The one or more pairs of matching simulation combinations previously identified at 412 may be revised to add one or more additional pairs of matching simulation combinations and/or to remove one or more existing pairs of matching simulation combinations due to the addition of the one or more targets at 404. For example, the addition of an additional relevant signal may cause an existing pair of matching simulation combinations no longer match each other due to the presence of this additional relevant signal. As a result, an irrelevant portion may be further partitioned into one or more smaller irrelevant portions and one or more smaller relevant portion because of the changes in the pairs of matching simulation combinations.

FIG. 4C illustrates a more detailed block diagram for local or global expansion of one or more compressed transitions due to a change in the state or functionality of an additional signal of interest in one or more embodiments. For example, a counter signal in the set of relevant signals of interest may receive an instruction initiated manually by a user or automatically detected from the logic of at least a portion of an electronic design by an EDA tool to start counting at a particular clock cycle that belongs to a compressed, irrelevant portion.

At 424, a first signal may be identified as a candidate signal to add locally or globally into a set of signals of interest for a trace. In some embodiments where a signal is globally added to a set of signals of interest, the set of signals of interest, including the newly added signal, is applied globally to the analyses, operations, or manipulation of any portions (e.g., one or more irrelevant portions, one or more relevant portions, or one or relevant portions and one or more irrelevant portions) of a trace. In contrast, when a signal is locally added to a set of signals of interest, the set of signals of interest, including the newly added signal, is applied to one or more portions of a trace but is not applied to at least one other portion of the trace. An embodiment may examine each irrelevant portion in the current compressed trace and determine whether such a signal has multiple signal values (e.g., a counter starts counting and hence has multiple counter values) within each irrelevant portion in the trace at 426. The addition or introduction of this signal to the set of signals of interest may then cause the clock cycles hidden in an irrelevant portion to be reclassified into one or more relevant portions and one or more irrelevant portions at 428, and therefore the trace warping techniques may display a trace with different compressed cycles at 430.

FIG. 4F illustrates another more detailed block diagram for local or global expansion of one or more compressed transitions due to a change in the state or functionality of a signal of interest in one or more embodiments. In these one or more embodiments, a first signal may be identified at 424 as a candidate signal to add locally or globally into a set of signals of interest for a trace in an identical or substantially similar manner as that described in FIG. 4C. Rather than proceeding to 426 as illustrated in FIG. 4C, an irrelevant portion currently shown in the trace as compressed may be identified at 432 in these one or more embodiments illustrated in FIG. 4F, and these trace warping techniques described herein may then determine, at 434, a list of candidate signals to be added to the set of signals of interest locally to modify this specific irrelevant portion identified at 432, while one or more other irrelevant portions remain using the original set of signals of interest in some embodiments. In some other embodiments where the list of candidate signals are globally added into a set of signals of interest, all irrelevant portions in the trace use the set of signals of interest including the list of candidate signals. These candidate signals have multiple values among cycles within this portion of the trace that is currently regarded as irrelevant. The confirmation from a user to add such signal will modify this portion of the trace at 436 so that some cycles will now be relevant and be shown in the resulting trace displayed after the modification of the set of signals of interest.

FIG. 4D illustrates a more detailed block diagram for local or global compression and decompression of a trace due to an addition a signal of interest in one or more embodiments. An addition signal may be identified at 432D and added into a set of signals of interest to create a revised set of signals of interest. Each irrelevant portion in a trace as well as the respective matching simulation combinations may be identified at 434D. With the introduction and addition of an additional signal, acts 434D through 438D apply globally to the entire trace in some embodiments.

More precisely, the addition of an additional signal into the set of signals of interest alter the simulation combinations. As a result, two matching simulation combinations may no longer match each other because the additional signal may exhibit different states or values at the two corresponding clock cycles of the matching simulation combinations. Acts 434D through 438D examine all irrelevant portions in the trace and decompress those irrelevant portions at least a part of each portion is reclassified as relevant. For each irrelevant portion, the matching simulation combinations may be updated at 436D with the states or values of the additional signal identified at 434D. Each of the identified irrelevant portion may then be reclassified into one or more relevant portions by decompressing these one or more relevant portions. In some embodiments where not the entire irrelevant portion is rendered relevant by the introduction of the identified additional signal, the identified irrelevant portion may be again partially compressed into one or more irrelevant portions. The process may repeat the acts 434D through 438D until all the irrelevant portions in the trace have been processed for the trace.

Acts 440D through 446D apply locally to one or more irrelevant portions but not all the irrelevant portions of the trace in some embodiments. At 440D, an irrelevant portion affected by the introduction of the additional signal and hence the revision of the set of signals of interest may be identified. The simulation combinations in or corresponding to the irrelevant portion may be updated at 442D using the revised set of signals of interest now including the additional signal. Due to the local application of acts 440 through 446D, another irrelevant portion to which acts 440D through 446D are not applied may nevertheless refer to the original set of signals of interest that does not include the additional signal and may thus remain compressed. At 444D, the irrelevant portion may then be decompressed into one or more relevant portions. In some embodiments, the irrelevant portion may not be rendered relevant in its entirety by the introduction of the additional signal, That is, one or more smaller portions of the irrelevant portion still remain irrelevant despite the introduction of the additional signal (e.g., the respective simulation combinations still match each other for each of these one or more smaller portions). In these embodiments, these one or more smaller portions may be classified as irrelevant and may thus be compressed again at 446D.

An additional signal may be further identified at 432D; and this additional signal may be designated as one or more additional relevant signals, or whether the designation or introduction of these one or more additional signals may cause changes to the set of relevant signals at 434. The flow diagram may return to 406 to determine whether the one or more relevant signals are to be revised. With the identification of these one or more additional signals, it may be determined whether one or more existing compressed transitions are to be expanded or decompressed at 438.

The one or more pairs of matching simulation combinations or state identifications that match each other may be updated, if necessary or desired, at 442D as a result of the introduction of the one or more additional signals. With an introduction of an additional signal, simulation combinations that are previously determined to match each other may no longer match each other. As a result, the previously determined matching simulation combinations may need to be revised or updated due to the introduction of an additional signal. The identification or introduction of one or more additional signals may be performed incrementally or interactively, and these techniques described herein automatically make necessary or desired adjustments in response to the incremental or interactive introduction or identification of these one or more additional signals to selectively compress one or more portions of the trace display over a wide range of clock (e.g., millions of clock cycles) in a manageable presentation, without losing vital information.

FIGS. 5A-G illustrate an example of trace warping for a simplified electronic design in one or more embodiments. In addition to the description of FIGS. 5A-G above in example to aid the description of FIG. 2, FIG. 5B illustrates the identification of a clock cycle 502B corresponding to a counter value "5". Because only one clock cycle corresponds to the counter value "5", there is no pair of matching simulation combinations or state identifications (the counter value in this example). In FIG. 5C, two clock cycles 504C and 506C are identified to correspond to the counter value "4". Therefore, one pair of matching simulation combinations or state identifications may be identified for the example illustrated in FIGS. 5A-G.

The clock cycles in the sub-range 502C between the first clock cycle 504C and the second clock cycle 506C may be identified as the target for compression based on the premise, observation, or theory that the counter starts counting in a clock cycle preceding the first clock 504C and reaches a counter value "4" during the first clock cycle 504C. The counter values progresses through a series of other values and eventually returns to the counter value "4" again in the second clock cycle 506C.

In FIG. 5D, six clock cycles are identified to correspond to the counter value "3". Therefore, there may be multiple pairs of matching simulation combinations or state identifications for the counter value "3" in this example. The clock cycles in the sub-range 502D between the first clock cycle 504D and the second clock cycle 506D may be identified as the target for compression. The sub-range 502D represents the sub-range including the largest number of clock cycles and may be selected as the target for compression in some embodiments based on the premise, observation, or theory that the counter starts counting in a clock cycle preceding the first clock 504D and reaches a counter value "3" during the first clock cycle 504D.

The counter values progresses through a series of other values and returns to the same counter value "3" multiple times until the last occurrence of the same counter value "3" in the second clock cycle 506D. The portion of the electronic circuit may be assumed to reach the same state during the first clock cycle and the second cycle. In some other embodiments, a shorter sub-range including a fewer number of clock cycles may also be selected as the target for compression.

In FIG. 5D, six clock cycles are identified to correspond to the counter value "2". Therefore, there may be multiple pairs of matching simulation combinations or state identifications for the counter value "2" in this example. The clock cycles in the sub-range 502E between the first clock cycle 504E and the second clock cycle 506E may be identified as the target for compression. The sub-range 502E represents the sub-range including the largest number of clock cycles and may be selected as the target for compression in some embodiments based on the premise, observation, or theory that the counter starts counting in a clock cycle preceding the first clock 504E and reaches a counter value "2" during the first clock cycle 504E.

The counter values progresses through a series of other values and returns to the same counter value "2" multiple times until the last occurrence of the same counter value "2" in the second clock cycle 506E. The portion of the electronic circuit may be assumed to reach the same state during the first clock cycle and the second cycle. In some other embodiments, a shorter sub-range including a fewer number of clock cycles may also be selected as the target for compression.

In FIG. 5F, six clock cycles are identified to correspond to the counter value "1". Therefore, there may be multiple pairs of matching simulation combinations or state identifications for the counter value "1" in this example. The clock cycles in the sub-range 502F between the first clock cycle 504F and the second clock cycle 506F may be identified as the target for compression. The sub-range 502F represents the sub-range including the largest number of clock cycles and may be selected as the target for compression in some embodiments based on the premise, observation, or theory that the counter starts counting in a clock cycle preceding the first clock 504F and reaches a counter value "1" during the first clock cycle 504F.

The counter values progresses through a series of other values and returns to the same counter value "1" multiple times until the last occurrence of the same counter value "1" in the second clock cycle 506F. The portion of the electronic circuit may be assumed to reach the same state during the first clock cycle and the second cycle. In some other embodiments, a shorter sub-range including a fewer number of clock cycles may also be selected as the target for compression.

In FIG. 5G, six clock cycles are identified to correspond to the counter value "0". Therefore, there may be multiple pairs of matching simulation combinations or state identifications for the counter value "0" in this example. The clock cycles in the sub-range 502G between the first clock cycle 504G and the second clock cycle 506G may be identified as the target for compression. The sub-range 502G represents the sub-range including the largest number of clock cycles and may be selected as the target for compression in some embodiments based on the premise, observation, or theory that the counter starts counting in a clock cycle preceding the first clock 504G and reaches a counter value "1" during the first clock cycle 504G.

The counter values progresses through a series of other values and returns to the same counter value "0" multiple times until the last occurrence of the same counter value "0" in the second clock cycle 506G. The portion of the electronic circuit may be assumed to reach the same state during the first clock cycle and the second cycle. In some other embodiments, a shorter sub-range including a fewer number of clock cycles may also be selected as the target for compression.

In these diagrams, multiple clock cycles (e.g., 502C, 502D, 502E, 502F, and 502G) can be compressed in the trace display. One of the sub-ranges 502C, 502D, 502E, 502F, and/or 502G may be collapsed to reduce the number of clock cycles presented in the trace display. For example, no compression may be done for the counter value "5" due to the absence of any pair of matching simulation combinations or state identifications. The trace display may be first compressed by collapsing the sub-range 502C so that only the first state 504C remains in the trace display. However, once one of the sub-ranges, such as 502C is compressed, other subranges may overlap with the said compressed subrange, and hence the full 502D, 502E, 502F, and 502G would not be applicable and smaller ranges will be selected for subsequent compression Depending on the order of compression, the next target for compression may be identified and adjusted according to the previous compressions. If the sub-range corresponding to the counter value "4" is first compressed, the sub-range (e.g., 502D) corresponding to the counter value "3" may be adjusted so that the remaining portion of the sub-range 502D may be the next target for compression. Similarly, the sub-range (e.g., 502E) corresponding to the counter value "2" may be identified as the next target for compression and may be adjusted after compressing the sub-ranges corresponding to the counter values "4" and "3".

The sub-range (e.g., 502F) corresponds to the counter value "1" may be identified as the next target for compression and may be adjusted after compressing the sub-ranges corresponding to the counter values "4", "3", and "2". The sub-range (e.g., 502G) corresponds to the counter value "0" may be identified as the next target for compression and may be adjusted after compressing the sub-ranges corresponding to the counter values "4", "3", "2", and "1".

Figure 6A:
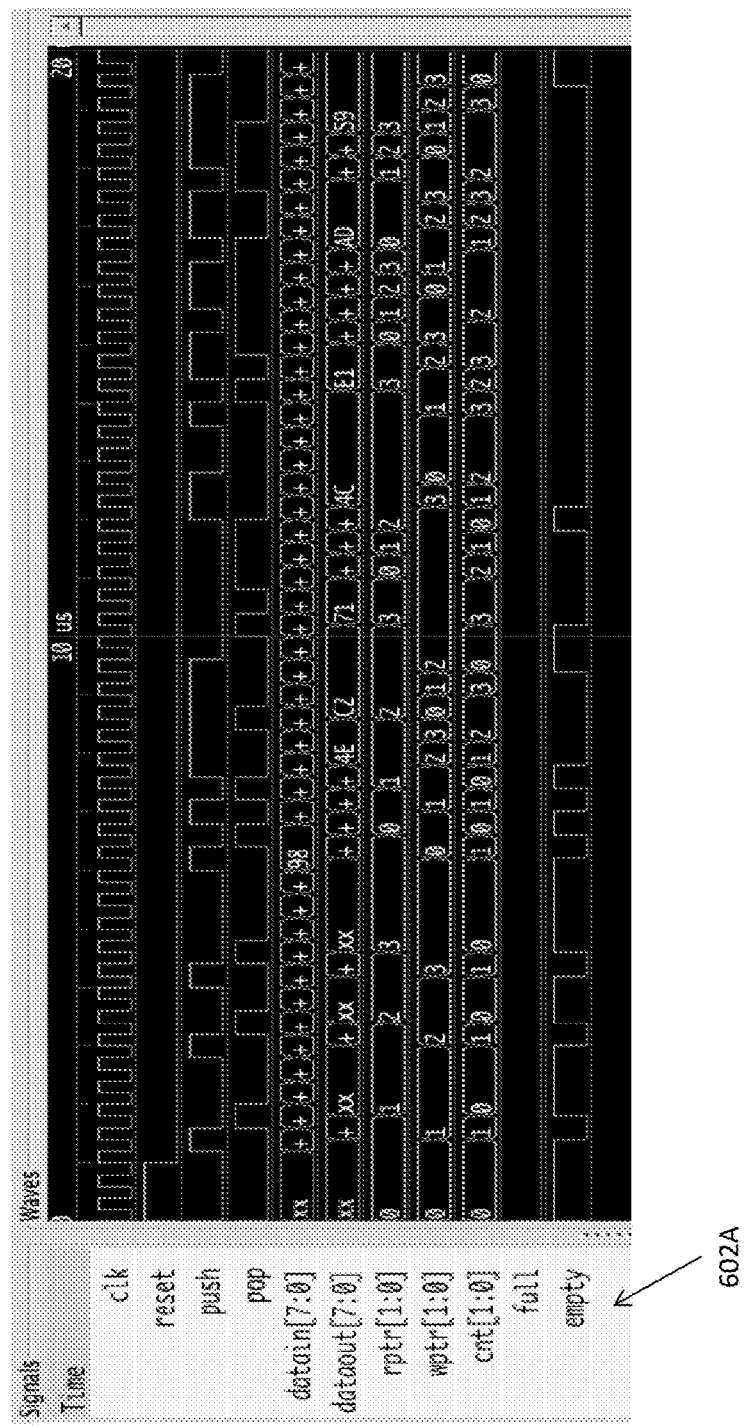
FIGS. 6A-B illustrate another example of implementing trace warping for electronic designs in one or more embodiments.
Figure 6B:
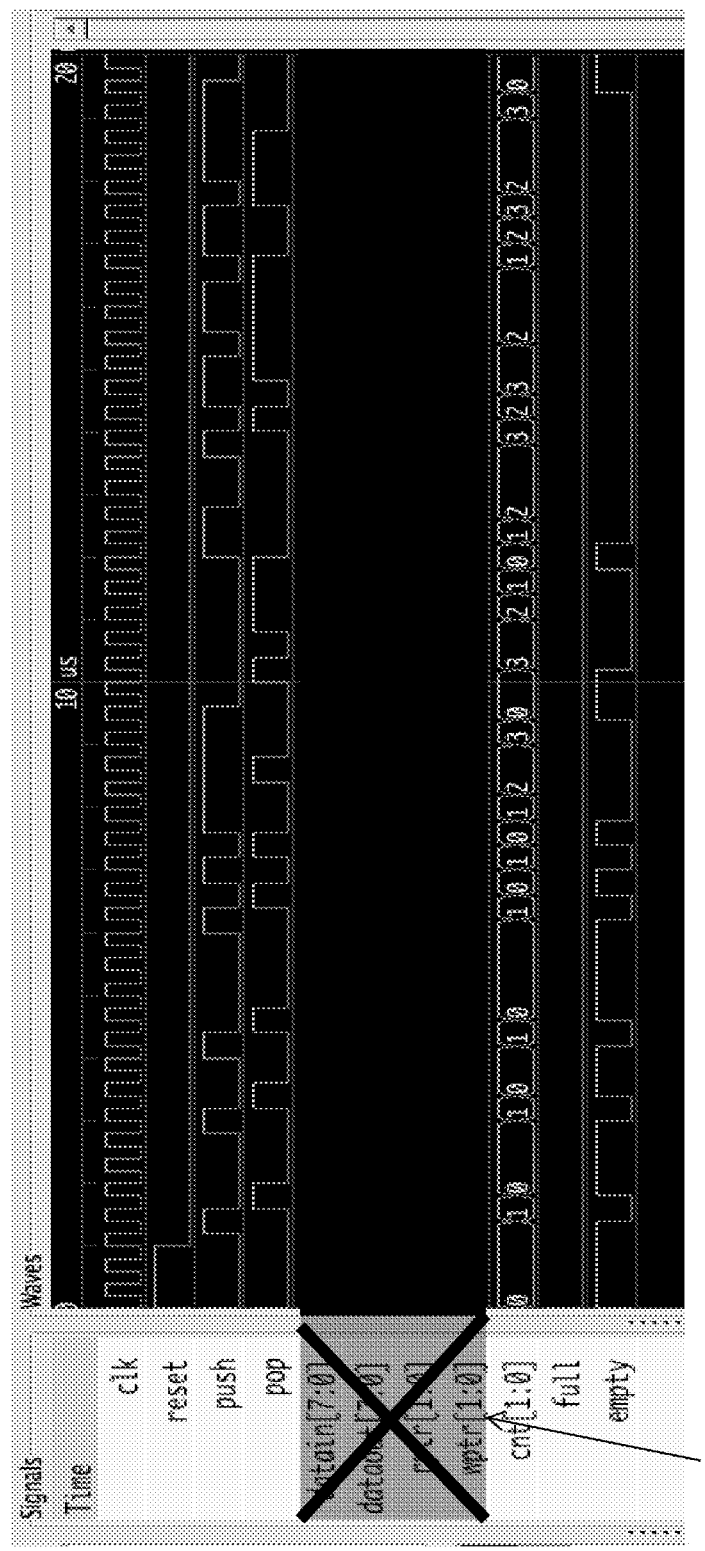

FIGS. 6A-B illustrate another example of implementing trace warping for electronic designs in one or more embodiments. More specifically, FIG. 6A illustrates a trace display including a plurality of signals 602A for an electronic design or a portion thereof and a plurality of waveforms. FIG. 6B illustrates that one or more signals 602B may be identified as one or more irrelevant signals or ignored in subsequent processing (e.g., in the determination of pairs of matching simulation combinations or state identifications). These one or more signals 602B may be textually and/or graphically de-emphasized, suppressed, or hidden in the trace display.

Figure 7A:
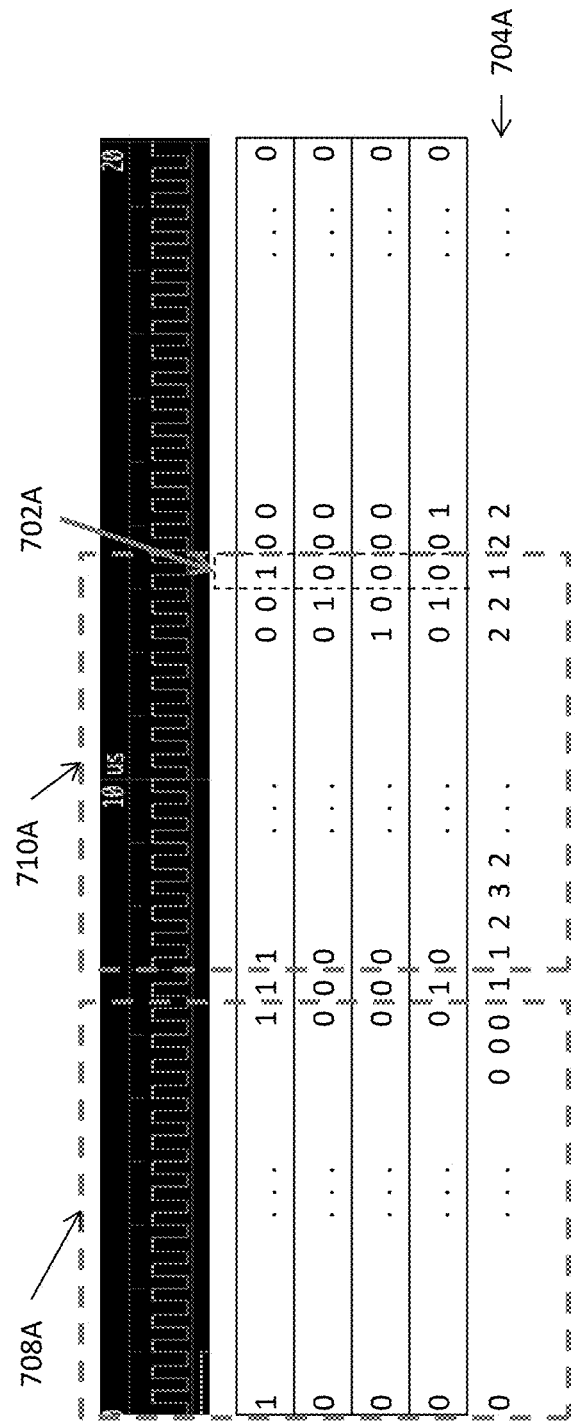

FIGS. 7A-C illustrate an example of implementing trace warping for electronic designs for a simplified electronic design in one or more embodiments. In this example illustrated in FIGS. 7A-C, each signal has a signal state or value in each clock cycle, and thus each clock cycle corresponds to a simulation combination. For example, the first clock cycle corresponds to the simulation combination of {1, 0, 0, 0, 0, 0}. Five rows, corresponding to five signals are shown in FIG. 7A. The first four signals are the set of signals of interest. In addition to these four signals, the trace display in FIG. 7A also includes a counter signal 704A. In this example, a target signal (shown in the first row) and its relevant signals are used as the set of signals of interest, with the cycle at 702A identified as the basis to identify matching states in other cycles. Each of the two boxes 708A and 710A with dashed boundaries represents a sub-range of clock cycles that may be collapsed or compressed. Adding 704A to the set of signals of interest will not change 708A but may change 710A to be revised.

FIG. 7B illustrates a trace display or a portion thereof including the state 702B (e.g., a simulation combination) of a finite state machine (e.g., an electronic design or a portion thereof). The trace display illustrated in FIG. 7B also includes a counter overflow signal 704B having value to indicate whether counter overflow has occurred. In this example, counter overflow occurs at state 708B having a value of "1" for the counter overflow signal. The trace display illustrated in FIG. 7B also includes a symbolic representation 706B indicative of the state 710B being a compressed transition.

FIG. 7C indicates the introduction of an additional signal (e.g., a counter) 702C that starts counting in clock cycle 706C (having the counter value "0" and corresponding to the clock cycle 710B in FIG. 7B) and reaches the maximum value in clock cycle 708C (having the counter value "Max"). With the incremental or interactive introduction of the additional signal 702C, the compressed transition indicated by the symbolic representation 706B may be decompressed or expanded into 704C to accommodate the additional counter values for the counter signal 702C.

System Architecture Overview

Figure 8:
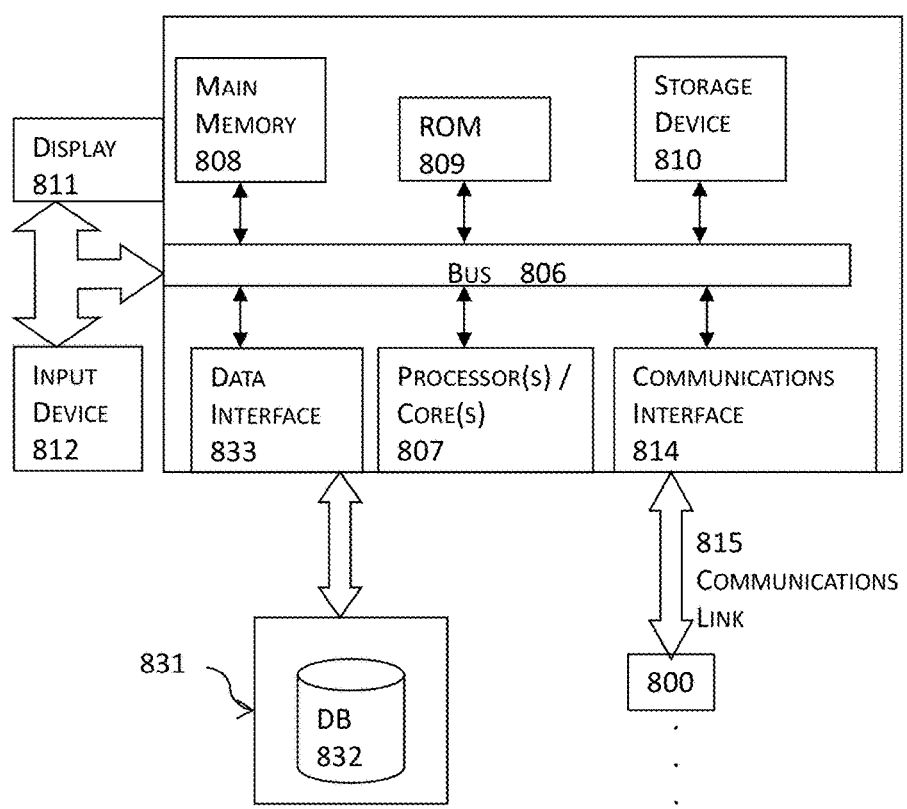
FIG. 8 illustrates a computerized system on which a method for implementing trace warping for electronic designs may be implemented.

FIG. 8 illustrates a block diagram of an illustrative computing system 800 suitable for implementing trace warping for electronic designs as described in the preceding paragraphs with reference to various figures. Computer system 800 includes a bus 806 or other communication module for communicating information, which interconnects subsystems and devices, such as processor 807, system memory 808 (e.g., RAM), static storage device 809 (e.g., ROM), disk drive 810 (e.g., magnetic or optical), communication interface 814 (e.g., modem or Ethernet card), display 811 (e.g., CRT or LCD), input device 812 (e.g., keyboard), and cursor control (not shown).

According to one embodiment, computing system 800 performs specific operations by one or more processor or processor cores 807 executing one or more sequences of one or more instructions contained in system memory 808. Such instructions may be read into system memory 808 from another computer readable/usable storage medium, such as static storage device 809 or disk drive 810. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 807, where the one or more processors, one or more processor cores, or combination thereof executes one or more threads. For example, various acts of determination, compression, decompression, etc. may be performed by one or more modules (e.g., one or more modules described in FIG. 1) including or functioning in tandem with one or more processors, one or more processor cores, or combination thereof.

A module described herein may also be implemented as a pure hardware module (e.g., a block of electronic circuit components, electrical circuitry, etc.) or a combination of a hardware module and a software block that jointly perform various tasks to achieve various functions or purposes described herein or equivalents thereof. For example, a module described herein may be implemented as an application-specific integrated circuit (ASIC) in some embodiments.

In these embodiments, a module may thus include, for example, a microprocessor or a processor core and other supportive electrical circuitry to perform specific functions which may be coded as software or hard coded as a part of an application-specific integrated circuit, ROM (read only memory), PROM (programmable read only memory), EPROM (erasable programmable read only memory), etc. despite the fact that these microprocessor, processor core, and electrical circuitry may nevertheless be shared among a plurality of module. A module described herein or an equivalent thereof may perform its respective functions alone or in conjunction with one or more other modules. A module described herein or an equivalent thereof may thus invoke one or more other modules by, for example, issuing one or more commands or function calls. The invocation of one or more other modules may be fully automated or may involve one or more user inputs. To the extent that a module includes a piece of software, the software is stored in a non-transitory computer accessible storage medium such as computer memory.

The term "computer readable storage medium" or "computer usable storage medium" as used herein refers to any non-transitory medium that participates in providing instructions to processor 807 for execution. Such a medium may take many forms, including but not limited to, non-volatile media and volatile media. Non-volatile media includes, for example, optical or magnetic disks, such as disk drive 810. Volatile media includes dynamic memory, such as system memory 808. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 800. According to other embodiments of the invention, two or more computer systems 800 coupled by communication link 815 (e.g., LAN, PTSN, or wireless network) may perform the sequence of instructions required to practice the invention in coordination with one another.

Computer system 800 may transmit and receive messages, data, and instructions, including program, i.e., application code, through communication link 815 and communication interface 814. Received program code may be executed by processor 807 as it is received, and/or stored in disk drive 810, or other non-volatile storage for later execution. In an embodiment, the computing system 800 operates in conjunction with a data storage system 831, e.g., a data storage system 831 that includes a database 832 that is readily accessible by the computing system 800. The computing system 800 communicates with the data storage system 831 through a data interface 833. A data interface 833, which is coupled with the bus 806, transmits and receives electrical, electromagnetic or optical signals that include data streams representing various types of signal information, e.g., instructions, messages and data. In embodiments of the invention, the functions of the data interface 833 may be performed by the communication interface 814.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer-implemented method for implementing trace warping for electronic designs, the computer-implemented method comprising:
    identifying at least a portion of an electronic design having a set of signals of interest corresponding to a plurality of simulation combinations over a range of clock cycles in a trace display;
    identifying a pair of matching simulation combinations from one or more pairs of matching simulation combinations for the set of signals of interest;
    identifying a first clock cycle and a second clock cycle corresponding to the pair of matching simulation combinations which has been identified in the range of clock cycles; and
    compressing a plurality of clock cycles between the first clock cycle and the second clock cycle.

2. The computer-implemented method of claim 1, the computer-implemented method further comprising:
    identifying a target signal having a signal state in a target clock cycle into the set of signals of interest; and
    identifying one or more relevant signals based in part or in whole upon the target signal.

3. The computer-implemented method of claim 2, wherein the identifying the one or more relevant signals comprises:
    performing one or more cone of influence analyses, one or more why analyses, or a combination of one or more cone of influence analyses and one or more why analyses for the target signal to identify the one or more relevant signals.

4. The computer-implemented method of claim 3, wherein the identifying the one or more relevant signals further comprises:
    performing the trace warping by partitioning the trace display or the range of clock cycles therein with at least the pair matching simulation combinations into one irrelevant portion and at most two relevant portions;
    identifying a first signal value or state for the first clock cycle and a second signal value or state for the second clock cycle; and
    determining whether the first signal value or state matches the second signal value or state.

5. The computer-implemented method of claim 1, wherein the set of signals of interest comprises all signals for said at least the portion of the electronic design.

6. The computer-implemented method of claim 1, the computer-implemented method further comprising:
    performing the trace warping by partitioning the trace display or the range of clock cycles therein with at least the pair matching simulation combinations into one irrelevant portion and at most two relevant portions.

7. The computer-implemented method of claim 1, wherein the compressing the plurality of clock cycles between the first clock cycle and the second clock cycle comprises:
    graphically and/or textually de-emphasizing, suppressing, collapsing, or hiding the plurality of clock cycles between the first clock cycle and the second clock cycle into a single clock cycle;
    representing the plurality of clock cycles with a symbolic representation indicative of a compressed transition; and
    isolating a candidate root cause for a signal state of interest by performing verification or debugging on a compressed trace display having the plurality of clock cycles represented as the single clock cycle.

8. The computer-implemented method of claim 1, the computer-implemented method further comprising:
identifying a first signal for said at least the portion of the electronic design; and
ignoring or excluding the first signal from a subsequent determination of the one or more pairs of matching simulation combinations.

9. The computer-implemented method of claim 1, the computer-implemented method further comprising:
identifying a first signal value or state for the first clock cycle and a second signal value or state for the second clock cycle; and
determining whether the first signal value or state matches the second signal value or state.

10. The computer-implemented method of claim 9, wherein the identifying the first signal value or state for the first clock cycle and the second signal value or state comprises:
transforming a first simulation combination for the first clock cycle into the first signal value or state; and
transforming a second simulation combination for the second clock cycle into the second signal value or state.

11. The computer-implemented method of claim 1, the computer-implemented method further comprising:
determining an order of compression for the one or more pairs of matching simulation combinations; and
compressing the plurality of clock cycles between the first clock cycles and the second clock cycle based in part or in whole upon the order of compression.

12. The computer-implemented method of claim 1, the computer-implemented method further comprising:
identifying a compressed transition in the trace display; and
expanding or decompressing at least a part of the compressed transition and reclassifying said at least the part of the compressed transition as one or more relevant portions for the trace display.

13. The computer-implemented method of claim 1, the computer-implemented method further comprising:
incrementally or interactively identifying an additional signal into the set of signals of interest; and
determining whether at least one pair of the one or more pairs of matching combinations is to be revised based in part or in whole upon the additional signal.

14. The computer-implemented method of claim 1, the computer-implemented method further comprising:
expanding or decompressing an irrelevant portion corresponding to at least one pair of the one or more pairs of matching simulation combinations into one or more relevant portions in the trace display; and
compressing one or more smaller irrelevant portions in the irrelevant portion in the trace display when the one or more smaller irrelevant portions are determined to exist based in part or in whole upon the at least one modified pair of matching simulation combinations.

15. A system for implementing trace warping for electronic designs, comprising:
one or more modules, at least one of which is stored in part or in whole in memory and comprises at least one processor including one or more processor cores executing one or more threads in a computing system;
a non-transitory computer accessible storage medium storing thereupon program code that includes a sequence of instructions that, when executed by the at least one processor, causes the at least one processor at least to:
identify at least a portion of an electronic design having a set of signals of interest corresponding to a plurality of simulation combinations over a range of clock cycles in a trace display;
identify a pair of matching simulation combinations from one or more pairs of matching simulation combinations for the set of signals of interest;
identify a first clock cycle and a second clock cycle corresponding to the pair of matching simulation combinations which has been identified in the range of clock cycles; and
compress a plurality of clock cycles between the first clock cycle and the second clock cycle.

16. The system of claim 15, wherein the program code includes the sequence of instructions that, when executed by the at least one processor, further cause the at least one processor to:
incrementally or interactively identify an additional signal into the set of signals of interest;
determine whether at least one pair of the one or more pairs of matching combinations is to be revised based in part or in whole upon the additional signal; and
modify the at least one pair of one or more pairs of matching simulation combinations into at least one modified pair of matching simulation combinations based in part or in whole upon the additional signal when the at least one pair of the one or more pairs of matching combinations is determined to be revised.

17. The system of claim 16, wherein the program code includes the sequence of instructions that, when executed by the at least one processor, further cause the at least one processor to:
expand or decompress an irrelevant portion corresponding to the at least one pair of the one or more pairs of matching simulation combinations into one or more relevant portions in the trace display; and
compress one or more smaller irrelevant portions in the irrelevant portion in the trace display when the one or more smaller irrelevant portions are determined to exist based in part or in whole upon the at least one modified pair of matching simulation combinations.

18. An article of manufacture comprising a non-transitory computer accessible storage medium having stored thereupon a sequence of instructions which, when executed by at least one processor or at least one processor core executing one or more threads, causes the at least one processor or the at least one processor core to perform a set of acts for implementing trace warping for electronic designs, the set of acts comprising:
identifying at least a portion of an electronic design having a set of signals of interest corresponding to a plurality of simulation combinations over a range of clock cycles in a trace display;
identifying a pair of matching simulation combinations from one or more pairs of matching simulation combinations for the set of signals of interest;
identifying a first clock cycle and a second clock cycle corresponding to the pair of matching simulation combinations which has been identified in the range of clock cycles; and
compressing a plurality of clock cycles between the first clock cycle and the second clock cycle.

19. The article of manufacture of claim 18, the set of acts further comprising:

incrementally or interactively identifying an additional signal into the set of signals of interest;

determining whether at least one pair of the one or more pairs of matching combinations is to be revised based in part or in whole upon the additional signal; and modifying the at least one pair of the one or more pairs of matching simulation combinations into at least one modified pair of matching simulation combinations based in part or in whole upon the additional signal when the at least one pair of the one or more pairs of matching combinations is determined to be revised.

20. The article of manufacture of claim 19, the set of acts further comprising:

expanding or decompressing an irrelevant portion corresponding to the at least one pair of the one or more pairs of matching simulation combinations into one or more relevant portions in the trace display; and compressing one or more smaller irrelevant portions in the irrelevant portion in the trace display when the one or more smaller irrelevant portions are determined to exist based in part or in whole upon the at least one modified pair of matching simulation combinations.

\* \* \* \* \*